US011842558B2

(12) United States Patent
Kim et al.

(10) Patent No.: US 11,842,558 B2
(45) Date of Patent: Dec. 12, 2023

(54) DISPLAY APPARATUS

(71) Applicant: Samsung Display Co., Ltd., Yongin-si (KR)

(72) Inventors: Donghyun Kim, Yongin-si (KR); Sunghoon Kim, Yongin-si (KR); Okkyung Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/830,315

(22) Filed: Jun. 1, 2022

(65) Prior Publication Data

US 2022/0415078 A1 Dec. 29, 2022

(30) Foreign Application Priority Data

Jun. 23, 2021 (KR) ........................ 10-2021-0081663

(51) Int. Cl.

*G06V 40/13* (2022.01)
*G06V 40/60* (2022.01)
*H10K 59/122* (2023.01)

(52) U.S. Cl.

CPC .............. *G06V 40/13* (2022.01); *G06V 40/60* (2022.01); *H10K 59/122* (2023.02)

(58) Field of Classification Search

None

See application file for complete search history.

(56) References Cited

U.S. PATENT DOCUMENTS 10,593,737 B2 3/2020 Bok
10,642,313 B1 * 5/2020 Wu .................... G06V 40/1306
11,062,656 B2 7/2021 Lee et al.
2020/0026412 A1 * 1/2020 Chen ...................... G06V 40/13
2020/0128116 A1 4/2020 Jang et al.
2020/0296096 A1 9/2020 Kim

FOREIGN PATENT DOCUMENTS

KR 10-2018-0049484 5/2018
KR 10-2020-0043578 4/2020
KR 10-2203506 1/2021
KR 10-2021-0013507 2/2021

* cited by examiner

*Primary Examiner* — Joseph R Haley

(74) *Attorney, Agent, or Firm* — H.C. Park & Associates, PLC

(57) ABSTRACT

A display apparatus includes a first surface which is foldable along a folding axis extending in a first direction and includes a display area, a second surface that is opposite to the first surface, a side surface connecting the first surface and the second surface, and at least two sensor portions disposed in at least one of the first surface and the side surface and configured to each provide a fingerprint recognition area.

17 Claims, 16 Drawing Sheets

DISPLAY APPARATUS

CROSS-REFERENCE TO RELATED APPLICATION

This application claims priority from and the benefit of Korean Patent Application No. 10-2021-0081663, filed on Jun. 23, 2021, which is hereby incorporated by reference for all purposes as if fully set forth herein.

BACKGROUND

Field

Embodiments of the invention relate generally to a display apparatus and, more specifically, to a foldable display apparatus.

Discussion of the Background

Mobile display apparatuses have been extensively used. The mobile display apparatuses may include notebook computers and tablet personal computers (PCs) as well as small display apparatuses, such as mobile phones.

Such mobile display apparatuses include a display panel for providing a user with various functions and visual information (e.g., an image or a video). Recently, research has been conducted to develop methods of increasing a display area of the mobile display apparatuses and, at the same time, of adding various functions to the display area of the mobile display apparatuses. Also, in order to increase the display area of the mobile display apparatuses while reducing a general size of the display apparatuses, the mobile display apparatuses has been developed to have a portion of which is foldable or rollable.

Also, a biometric sensor has been implemented in a display apparatus to sense, for example, a fingerprint. The biometric sensor has been used for unlocking the display apparatus instead of inputting a password thereon.

The above information disclosed in this Background section is only for understanding of the background of the inventive concepts, and, therefore, it may contain information that does not constitute prior art.

SUMMARY

Foldable display apparatuses constructed according to the principles of the invention are capable of providing a fingerprint recognition area in a display area for recognizing a fingerprint of a user such that convenience and security of the foldable display apparatuses are enhanced or improved.

Additional features of the inventive concepts will be set forth in the description which follows, and in part will be apparent from the description, or may be learned by practice of the inventive concepts.

According to an aspect of the invention, a display apparatus includes a first surface being foldable along a folding axis extending in a first direction, the first surface having a display area, a second surface opposite to the first surface, a side surface connecting the first surface and the second surface, and at least two sensor portions disposed in at least one of the first surface and the side surface, the at least two sensor portions configured to provide fingerprint recognition areas.

The at least two sensor portions may include a first sensor portion and a second portion spaced apart from the first sensor portion in a plan view, the first sensor portion and the second sensor portion configured to provide the fingerprint recognition areas to the display area of the first surface.

In a plan view, a center of the first sensor portion and a center of the second sensor portion may be respectively spaced apart from a first corner and a second corner of the display area by about 20 mm to about 100 mm.

In a plan view, the first sensor portion and the second sensor portion may be disposed on a same side with respect to the folding axis.

In a plan view, the first sensor portion and the second sensor portion may be disposed on opposite sides to each other with respect to the folding axis.

In a plan view, the first sensor portion and the second sensor portion may be substantially symmetrically disposed with respect to a symmetrical axis crossing a central portion of the display area.

The side surface of the display apparatus may include a first side surface and a second side surface facing in opposite directions to each other, and the at least two sensor portions may include a first lateral sensor portion and a second lateral sensor portion, the first lateral sensor portion and the second lateral sensor portion configured to provide the fingerprint recognition areas to the first side surface and the second side surface, respectively.

In a plan view, a center of the first lateral sensor portion and a center of the second lateral sensor portion may be respectively spaced apart from a first corner and a second corner of the display area by about 20 mm to about 100 mm.

In a plan view, the first lateral sensor portion and the second lateral sensor portion may be disposed on a same side with respect to the folding axis.

In a plan view, the first lateral sensor portion and the second lateral sensor portion may be disposed on opposite sides to each other with respect to the folding axis.

In a plan view, the first lateral sensor portion and the second lateral sensor portion may be substantially symmetrically disposed with respect to a symmetrical axis crossing a central portion of the display area.

The display area may include a bending display area overlapping the folding axis and extending in the first direction, and a first display area and a second display area disposed at both sides of the bending display area with the bending display area between the first display area and the second display area, and the first sensor portion and the second sensor portion may provide the fingerprint recognition areas that are different from each other to the bending display area.

The display apparatus may further include a battery module arranged, in a plan view, between the first sensor portion and the second sensor portion.

Each of the fingerprint recognition areas provided by the at least two sensor portions may have one of a circular shape, an oval shape, and a quadrangular shape.

The at least two sensor portions may include a first sensor portion configured to provide a first fingerprint recognition area to the display area of the first surface of the display apparatus, and a lateral sensor portion configured to provide a lateral fingerprint recognition area to the side surface of the display apparatus, and the first fingerprint recognition area and the lateral fingerprint recognition area may be adjacent to each other.

When the at least two sensor portions are configured to provide the fingerprint recognition area to the display area of the first surface of the display apparatus, the display area may be configure to display a fingerprint mark on the fingerprint recognition area.

A location of the fingerprint mark may be changed in each of the fingerprint recognition areas based on information about a size and a location of a fingerprint of a user that is recognized by the at least two sensor portions.

The display apparatus may be foldable such that a portion of the display area faces another portion of the display area.

According to another aspect of the invention, a display apparatus includes a display panel being foldable along a folding axis extending in a first direction, the display panel having a first surface including a display area, a cover disposed below the display panel, the cover comprising a first side surface and a second side surface facing in opposite directions to each other, a first sensor portion and a second sensor portion spaced apart from each other in a plan view, the first sensor portion and the second sensor portion configured to provide a fingerprint recognition area to the display area of the first surface of the display panel, and a first lateral sensor portion and a second lateral sensor portion configured to provide a fingerprint recognition area to the first side surface and the second side surface of the cover, respectively.

In a plan view, a center of the first sensor portion and a center of the second sensor portion may be respectively apart from a first corner and a second corner of the display area by about 20 mm to about 100 mm, and in a plan view, a center of the first lateral sensor portion and a center of the second lateral sensor portion may be respectively apart from the first corner and the second corner of the display area by about 20 mm to about 100 mm.

These general and specific embodiments may be implemented by using a system, a method, a computer program, or a combination of the system, the method, and the computer program.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
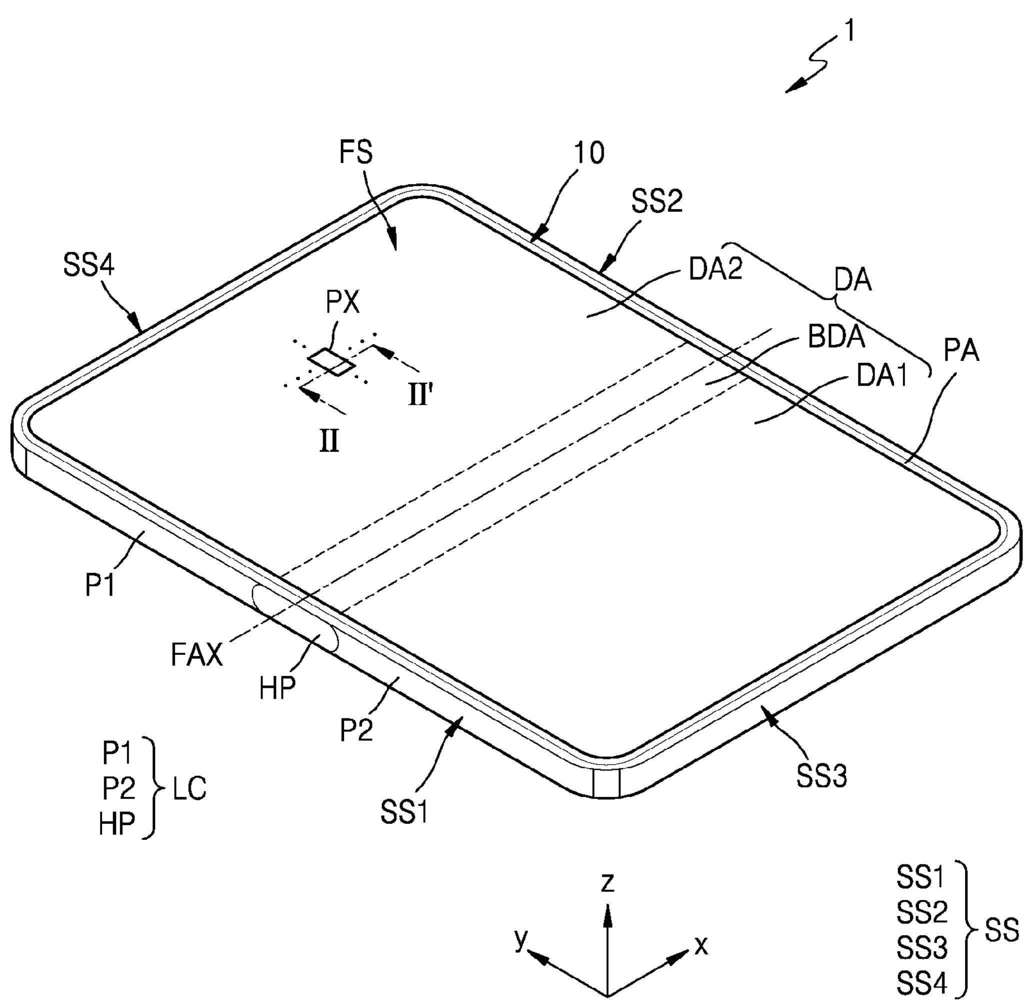
FIGS. 1A, 1B, and 1C are schematic perspective views of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element or a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z-axes, and may be interpreted in a broader sense. For example, they may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
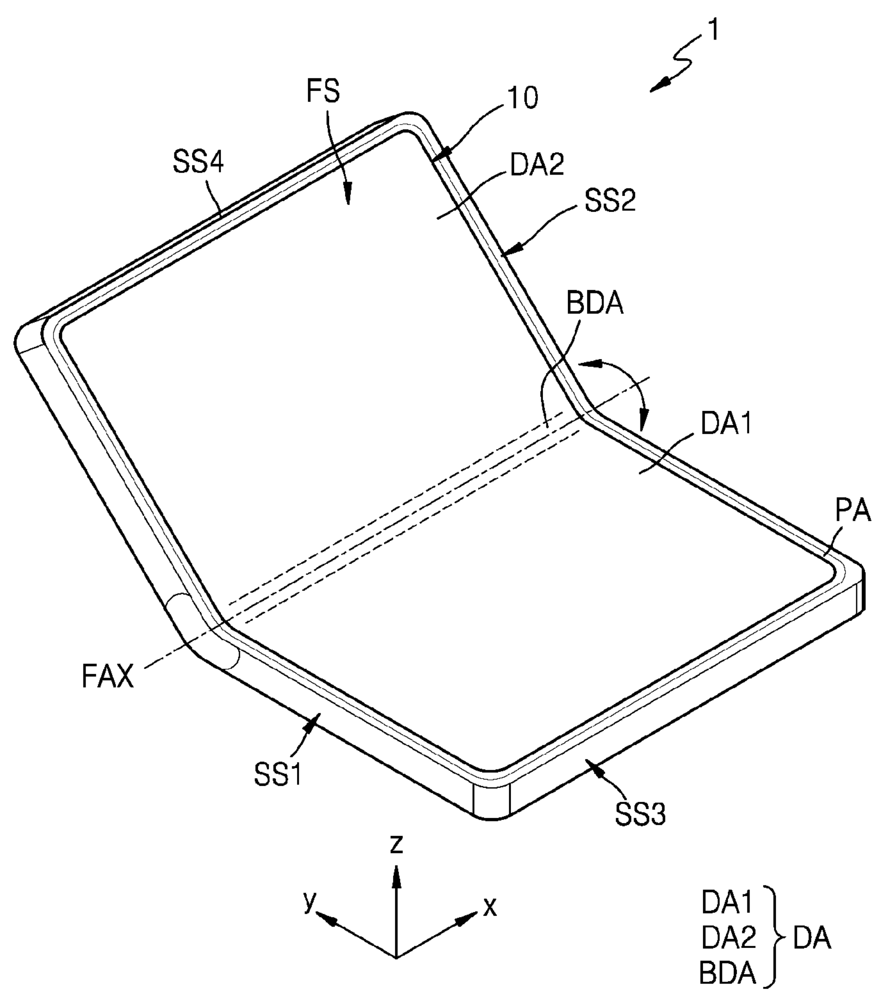
Figure 1C:
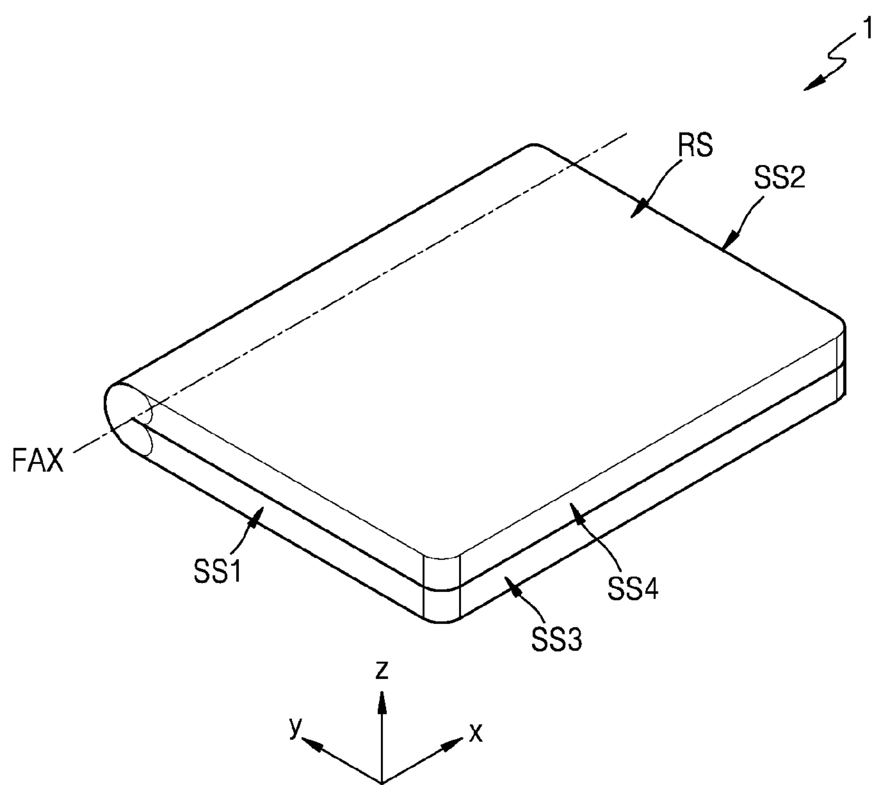

FIGS. 1A, 1B, and 1C are schematic perspective views of a display apparatus 1 according to an embodiment. FIG. 1A illustrates an unfolded state of the display apparatus 1, FIG. 1B illustrates a partially folded state of the display apparatus 1, and FIG. 1C illustrates a completely folded state of the display apparatus 1.

Referring to FIGS. 1A, 1B, and 1C, the display apparatus 1 may include a cover in the form of a lower cover LC and a display panel 10.

The lower cover LC may be arranged below the display panel 10 and may include a first part P1 and a second part P2 supporting the display panel 10. According to an embodiment, the lower cover LC may be folded based on a folding axis FAX between the first part P1 and the second part P2. Further, the lower cover LC may include a hinge portion HP between the first part P1 and the second part P2.

The display panel 10 may display an image and may include a display area DA and a peripheral area PA outside the display area DA. A plurality of pixels PX (e.g., sub-pixels) may be arranged in the display area DA. For example, the display area DA may display an image through arrays of the plurality of pixels PX (e.g., sub-pixels). The peripheral area PA may be a non-display area, which does not display an image. For example, various lines, driving circuits, etc. for providing electrical signals or power to the display area DA may be arranged in the peripheral area PA.

According to an embodiment, the display area DA may include a first display area DA1 and a second display area DA2 arranged, respectively, at both sides of the folding axis FAX. Also, the display area DA may include a bending display area BDA between the first display area DA1 and the second display area DA2. For example, the first display area DA1, the second display area DA2, and the bending display area BDA may individually display separate images. As another example, the first display area DA1, the second display area DA2, and the bending display area BDA may display a general image.

The display panel 10 including the display area DA may be folded based on the folding axis FAX extending in a first direction (for example, an x-axis direction). For example, the display area DA may be folded based on the folding axis FAX crossing the display area DA and extending in the first direction (for example, the x-axis direction). For example, the display area DA may be folded by bending the bending display area BDA such that the first display area DA1 and the second display area DA2 face each other.

FIGS. 1A, 1B, and 1C illustrate a case in which the folding axis FAX extends in the x-axis direction. However, according to another embodiment, the folding axis FAX may extend in a y-axis direction. According to another embodiment, on an x-y axes plane, the folding axis FAX may extend in a direction crossing the x-axis direction and the y-axis direction. Also, FIGS. 1A, 1B, and 1C illustrate a case in which there is one folding axis FAX. However, according to another embodiment, the display panel 10 may be bent a plurality of times based on a plurality of folding axes FAX crossing the display area DA.

The display apparatus 1 may include a first surface in the form of a front surface FS, which is an outer surface, a second surface in the form of a rear surface RS, which is an opposite surface to the front surface FS, and a side surface SS connecting the front surface FS to the rear surface RS. The front surface FS of the display apparatus 1 may be provided by the display panel 10 and may include the display area DA and the peripheral area PA of the display panel 10 described above. For example, the front surface FS of the display apparatus 1 may display an image through the display area DA. When the display apparatus 1 is folded based on the folding axis FAX, a portion of the front surface FS may face another portion of the front surface FS. The rear surface RS and the side surface SS may be outer surfaces provided by the lower cover LC and may be directly gripped by a user. In some embodiments, the rear surface RS may also include a separate display area, which displays an image through a separate display panel. In this case, the display area provided by the rear surface RS may be a sub-display area, and a display area provided by the front surface FS may be a main display area.

The display apparatus 1 may have an approximately rectangular shape, when viewed in a direction substantially perpendicular to the front surface FS of the display apparatus 1. For example, the display apparatus 1 may generally have a planar rectangular shape having a short side extending in the first direction (for example, the x-axis direction) and a long side extending in the second direction (for example, the y-axis direction) as illustrated in FIG. 1A. A corner, at which the side in the first direction and the side in the second direction meet each other, may have a rectangular shape or a round shape having a predetermined curvature as illustrated in FIG. 1A. However, the planar shape of the display apparatus 1 is not limited to a rectangular shape. For example, the planar shape of the display apparatus 1 may have various shapes, such as a polygonal shape including a triangular shape, a circular shape, an oval shape, an amorphous shape, and the like. However, for convenience of description, hereinafter, a case in which the display apparatus 1 has a planar rectangular shape is described.

The side surface SS of the display apparatus 1 may include first, second, third, and fourth side surfaces SS1, SS2, SS3, and SS4 that face in different directions from one another. For example, the first side surface SS1 may face in a negative x-axis direction, the second side surface SS2 may face in a positive x-axis direction, the third side surface SS3 may face in a negative y-axis direction, and the fourth side surface SS4 may face in a positive y-axis direction. The first side surface SS1 and the second side surface SS2 may face in opposite directions to each other, and the third side surface SS3 and the fourth side surface SS4 may face in opposite directions to each other. Each of the first side surface SS1 and the second side surface SS2 may connect the third side surface SS3 and the fourth side surface SS4.

The display apparatus 1 may include various product groups, such as a television, a notebook computer, a monitor, an advertising board, an Internet of things (IOT) device, etc., as well as portable devices, such as a mobile phone, a smartphone, a tablet personal computer (PC), a mobile communication terminal, an electronic notebook, an electronic book, a portable multimedia player (PMP), a navigation device, an ultra mobile PC (UMPC), etc. Hereinafter, for convenience of description, a case in which the display apparatus 1 is a notebook computer is described.

Figure 2:
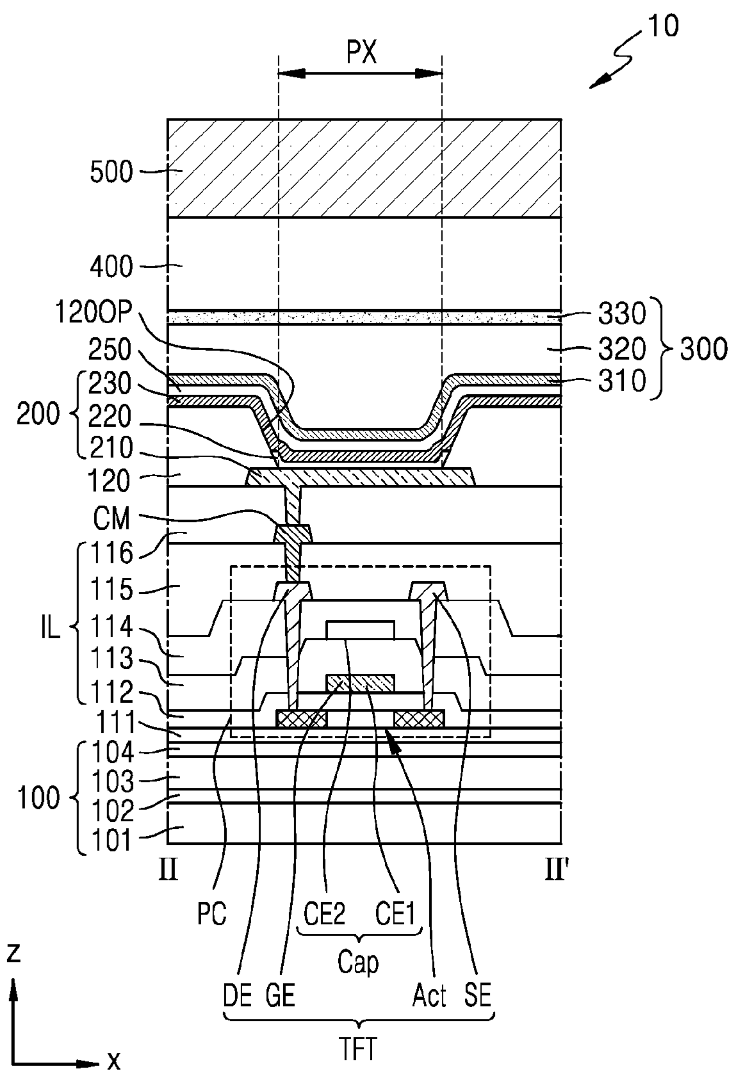
FIG. 2 is a schematic cross-sectional view of a portion of a display panel of the display apparatus of FIG. 1A.

FIG. 2 is a schematic cross-sectional view of a portion of a display panel included in a display apparatus according to an embodiment. The portion of the display panel illustrated in FIG. 2 may correspond to a cross-section of the display panel 10 taken along line II-II' of FIG. 1A.

Referring to FIG. 2, the display panel 10 may include a substrate 100. According to an embodiment, the substrate 100 may have a multi-layered structure including a base layer including polymer resins and an inorganic layer. For example, the substrate 100 may include a first base layer 101, a first barrier layer 102, a second base layer 103, and a second barrier layer 104 that are sequentially stacked, e.g., in a z-axis direction. For example, the first base layer 101 and the second base layer 103 may include polyimide (PI), polyethersulfone (PES), polyarylate (PAR), polyetherimide (PEI), polyethylene naphthalate (PEN), polyethylene terephthalate (PET), polyphenylene sulfide (PPS), polycarbonate (PC), cellulose triacetate (TAC), and/or cellulose acetate propionate (CAP). The first barrier layer 102 and the second barrier layer 104 may include an inorganic insulating material, such as silicon oxide, silicon oxynitride, and/or silicon nitride. The substrate 100 as described above may be flexible.

A buffer layer 111 may be arranged on the substrate 100. The buffer layer 111 may reduce or block penetration of impurities, moisture, or external materials from below the substrate 100 and may provide a planarized surface to the substrate 100. The buffer layer 111 may include an inorganic insulating material, such as silicon oxide, silicon oxynitride, and silicon nitride, and may include a single layer or multiple layers including the inorganic insulating materials described above.

A pixel circuit PC may be arranged on the buffer layer 111. The pixel circuit PC may include thin-film transistors TFTs and a storage capacitor Cap.

The thin-film transistor TFT of the pixel circuit PC may include a semiconductor layer Act, a gate electrode GE overlapping a channel area of the semiconductor layer Act, and a source electrode SE and a drain electrode DE connected to a source area and a drain area of the semiconductor layer Act, respectively.

The semiconductor layer Act on the buffer layer 111 may include polysilicon. Alternatively, the semiconductor layer Act may include amorphous silicon, an oxide semiconductor, or an organic semiconductor. The semiconductor layer Act may include the channel area, the drain area and the source area arranged at both sides of the channel area, respectively. The drain area and the source area may be doped with impurities.

The gate electrode GE may include a low-resistance metal material. The gate electrode GE may include a conductive material including Mo, Al, Cu, Ti, etc. and may include multiple layers or a single layer including the conductive materials described above.

A first gate insulating layer 112 may be arranged between the semiconductor layer Act and the gate electrode GE. The first gate insulating layer 112 may include, for example, an inorganic insulating material, such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$).

A second gate insulating layer 113 may be provided to cover the gate electrode GE. Similarly with the first gate insulating layer 112, the second gate insulating layer 113 may include an inorganic insulating material, such as $SiO_X$, $SiN_X$, $SiO_XN_Y$, $Al_2O_3$, $TiO_2$, $Ta_2O_5$, $HfO_2$, $ZnO_2$, etc.

According to an embodiment, the storage capacitor Cap may be arranged to overlap the thin-film transistor TFT. The storage capacitor Cap may include a first electrode CE1 and a second electrode CE2 overlapping each other. In some embodiments, the gate electrode GE of the thin-film transistor TFT may include the first electrode CE1 of the storage capacitor Cap.

The second electrode CE2 of the storage capacitor Cap may be arranged on the second gate insulating layer 113. The second electrode CE2 may overlap the gate electrode GE therebelow. Here, the gate electrode GE and the second electrode CE2 overlapping each other with the second gate insulating layer 113 therebetween may be included in the storage capacitor Cap. For example, the gate electrode GE overlapping the second electrode CE2 may function as the first electrode CE1 of the storage capacitor Cap. According to another embodiment, the storage capacitor Cap may not overlap the thin-film transistor TFT.

The second electrode CE2 may include Al, Pt, Pd, Ag, Mg, Au, Ni, Nd, Ir, Cr, Ca, Mo, Ti, W, and/or Cu and may include a single layer or multiple layers including the materials described above.

An interlayer insulating layer 114 may cover the second electrode CE2. The interlayer insulating layer 114 may include $SiO_2$, $SiN_X$, $SiO_XN_Y$, $Al_2O_3$, $TiO_2$, $Ta_2O_5$, $HfO_2$, $ZnO_2$, or the like. The interlayer insulating layer 114 may include a single layer or multiple layers including the inorganic insulating materials described above.

Each of the drain electrode DE and the source electrode SE may be arranged on the interlayer insulating layer 114. The drain electrode DE and the source electrode SE may be respectively connected to the drain area and the source area through contact holes formed in insulating layers therebelow. The drain electrode DE and the source electrode SE may include a highly conductive material. The drain electrode DE and the source electrode SE may include a conductive material including Mo, Al, Cu, Ti, etc., and may include multiple layers or a single layer including the materials described above. According to an embodiment, the drain electrode DE and the source electrode SE may have a multi-layered structure of Ti/Al/Ti.

A first planarization insulating layer 115 may cover the drain electrode DE and the source electrode SE. The first planarization insulating layer 115 may include an organic insulating material, such as a general-purpose polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A second planarization insulating layer 116 may be arranged on the first planarization insulating layer 115. The second planarization insulating layer 116 may include a material that is the same as the material of the first planarization insulating layer 115 and may include an organic insulating material, such as a general-purpose polymer such as PMMA or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

An emission device 200 may be arranged on the second planarization insulating layer 116. According to an embodiment, the emission device 200 may include an organic light-emitting diode OLED and may include a stack structure including a pixel electrode 210, an opposite electrode 230 arranged on the pixel electrode 210, and an intermediate layer 220 arranged between the pixel electrode 210 and the opposite electrode 230. The emission device 200 may emit light through an emission area. For example, the emission device 200 may emit red, green, or blue light. Here, the emission area may be defined as a pixel PX.

The pixel electrode 210 may be arranged on the second planarization insulating layer 116. The pixel electrode 210 may be connected to a contact metal CM on the first planarization insulating layer 115 through a contact hole formed in the second planarization insulating layer 116. The contact metal CM may be electrically connected to the thin-film transistor TFT of the pixel circuit PC through a contact hole formed in the first planarization insulating layer 115. Thus, the pixel electrode 210 may be electrically connected to the pixel circuit PC through the contact metal CM and may receive a driving current from the pixel circuit PC.

The pixel electrode 210 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the pixel electrode 210 may include a reflective layer including Ag, Mg, Al, Pt, Pd, Au, Ni, Nd, Ir, Cr, or a compound thereof. According to another embodiment, the pixel electrode 210 may further include a layer including ITO, IZO, ZnO, or $In_2O_3$, above/below the reflective layer described above. According to an embodiment, the pixel electrode 210 may have a triple-layered structure in which an ITO layer/an Ag layer/an ITO layer are sequentially stacked.

A pixel-defining layer 120 may be arranged on the pixel electrode 210. The pixel-defining layer 120 may cover an edge of the pixel electrode 210 and may include an opening 1200P overlapping a central portion of the pixel electrode 210. The opening 1200P may define an emission area of light emitted from the organic light-emitting diode OLED. A size (e.g., width) of the opening 1200P may correspond to a size (e.g., width) of the emission area. Thus, a size (e.g., width) of the pixel PX may be determined based on the size (e.g., width) of the opening 1200P of the pixel-defining layer 120.

The pixel-defining layer 120 may increase a distance between the edge of the pixel electrode 210 and the opposite electrode 230 above the pixel electrode 210 so as to prevent the occurrence of arc, surge, etc. at the edge of the pixel electrode 210. The pixel-defining layer 120 may be formed by using a spin coating method, etc., by using an organic insulating material, such as PI, polyamide, acryl resins, BCB, hexamethyldisiloxane (HMDSO), phenol resins, etc.

The intermediate layer 220 may include an emission layer arranged to overlap the pixel electrode 210. The emission layer may include polymers or a small molecular-weight organic material emitting light of a predetermined color. Alternatively, the emission layer may include an inorganic emission material or quantum dots.

According to an embodiment, the intermediate layer 220 may include a first functional layer and a second functional layer arranged below and above the emission layer, respectively. The first functional layer may be a component arranged below the emission layer and may include, for example, a hole transport layer (HTL), or an HTL and a hole injection layer (HIL). The second functional layer may be a component arranged above the emission layer and may include an electron transport layer (ETL) and/or an electron injection layer (EIL). The first functional layer and/or the second functional layer may be a common layer formed to partially or entirely cover the substrate 100 like the opposite electrode 230 to be described below.

The opposite electrode 230 may be arranged on the pixel electrode 210 and may overlap the pixel electrode 210. The opposite electrode 230 may include a conductive material having a low work function. For example, the opposite electrode 230 may include a transparent layer or a semi-transparent layer including Ag, Mg, Al, Pt, Pd, Au, Ni, Nd, Ir, Cr, Li, Ca, or an alloy thereof. Alternatively, the opposite electrode 230 may further include a layer, such as ITO, IZO, ZnO, or $In_2O_3$, on the transparent layer or the semi-transparent layer including the materials described above. For example, the opposite electrode 230 may be integrally formed to partially or entirely cover the display area DA (see FIG. 1A).

According to an embodiment, a capping layer 250 may be arranged on the emission device 200. The capping layer 250 may include an inorganic insulating material, such as silicon nitride, and/or an organic insulating material. When the capping layer 250 includes an organic insulating material, the capping layer 250 may include an organic insulating material, such as triamine derivatives, carbazole biphenyl derivatives, arylenediamine derivatives, tris(8-hydroxyquinolinato)aluminum ($Alq_3$), acrylic, PI, polyamide, etc.

An encapsulation layer 300 may be arranged on the capping layer 250. The encapsulation layer 300 may overlap the emission device 200. As described above, the encapsulation layer 300 may include at least one inorganic encapsulation layer and at least one organic encapsulation layer. According to an embodiment, FIG. 2 illustrates that the encapsulation layer 300 may include a stack structure including a first inorganic encapsulation layer 310, an organic encapsulation layer 320, and a second inorganic encapsulation layer 330.

The first inorganic encapsulation layer 310 and the second inorganic encapsulation layer 330 may include at least one inorganic material from among aluminum oxide, titanium oxide, tantalum oxide, hafnium oxide, ZnO, $SiO_X$, $SiN_X$, and $SiO_XN_Y$. The organic encapsulation layer 320 may include a polymer-based material. The polymer-based material may include an acryl-based resin, an epoxy-based resin, PI, polyethylene, etc. According to an embodiment, the organic encapsulation layer 320 may include acrylate. The organic encapsulation layer 320 may be formed by curing a monomer or coating a polymer. The organic encapsulation layer 320 may be transparent.

A touch sensing layer 400 including sensing electrodes and trace lines electrically connected to the sensing electrodes may be arranged on the encapsulation layer 300. The touch sensing layer 400 may obtain coordinate information according to an external input, for example, a touch event. The touch sensing layer 400 may sense the external input based on a self-capacitance method or a mutual capacitance method.

An optical functional layer 500 may be arranged on the touch sensing layer 400. The optical functional layer 500 may reduce a reflectivity of light (e.g., external light) incident from the outside toward the display panel 10 and/or improve the color purity of light emitted from the display panel 10.

According to an embodiment, the optical functional layer 500 may include a phase retarder and a polarizer. The phase retarder may include a film-type phase retarder or a liquid crystal coating-type phase retarder, and may include a $\lambda/2$ phase retarder and/or a $\lambda/4$ phase retarder. The polarizer may also include a film-type polarizer or a liquid crystal coating-type polarizer. The film-type polarizer may include an elongation-type synthetic resin film, and the liquid crystal coating-type polarizer may include liquid crystals arranged in a certain shape of arrangement. The phase retarder and the polarizer may further include a protective film.

According to another embodiment, the optical functional layer 500 may include a destructive interference structure. The destructive interference structure may include a first reflective layer and a second reflective layer disposed on different layers from each other. Destructive interference may occur in first reflective light reflected from the first reflective layer and second reflective light reflected from the second reflective layer. Thus, the reflectivity of external light may be decreased.

As described above, the display panel 10 may include the organic light-emitting diode OLED as the emission device 200. However, embodiments are not limited thereto. According to another embodiment, the display panel 10 may include a display panel including an inorganic light-emitting diode. For example, the display panel 10 may include an inorganic light-emitting display panel. According to another embodiment, the display panel 10 may include a quantum dot light-emitting display panel. Hereinafter, for convenience of description, the display panel 10 including the organic light-emitting diode OLED is described.

Figure 3:
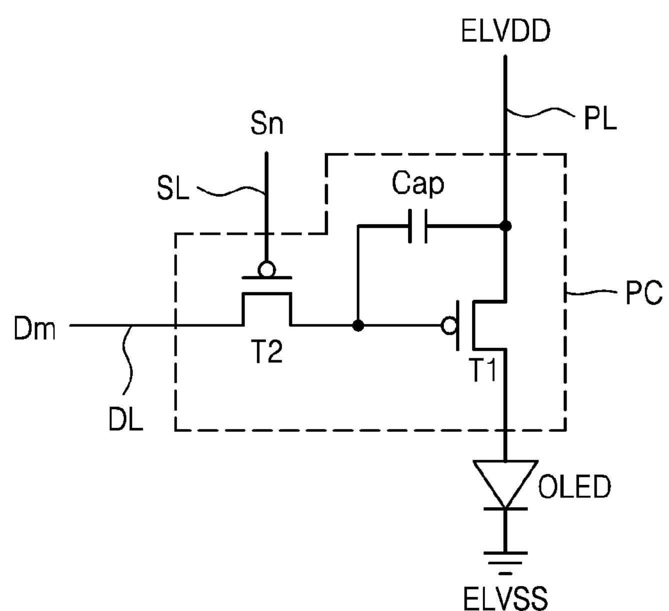
FIG. 3 is an equivalent circuit diagram of a pixel circuit of the display panel of the display apparatus of FIG. 2.

FIG. 3 is an equivalent circuit diagram of any one pixel circuit included in the display panel 10 of the display apparatus 1 according to an embodiment.

Referring to FIG. 3, the display panel 10 (see FIG. 2) may include the pixel circuit PC and the organic light-emitting diode OLED for emitting light by receiving a driving current through the pixel circuit PC.

The pixel circuit PC may include a plurality of thin-film transistors TFTs and the storage capacitor Cap. According to an embodiment, as illustrated in FIG. 3, the pixel circuit PC may include a first thin-film transistor T1, a second thin-film transistor T2, and the storage capacitor Cap. For example, the first thin-film transistor T1 may include a driving thin-film transistor, and the second thin-film transistor T2 may include a switching thin-film transistor. The second thin-film transistor T2 may be connected to a scan line SL and a data line DL and may be configured to transmit a data signal Dm provided through the data line DL, to the first thin-film transistor T1, in response to a scan signal Sn provided through the scan line SL.

The storage capacitor Cap may be connected to the second thin-film transistor T2 and a driving voltage line PL and may be configured to storage a voltage corresponding to a difference between a driving voltage ELVDD applied to the driving voltage line PL and a data voltage applied to the second thin-film transistor T2.

The first thin-film transistor T1 may be connected to the driving voltage line PL and the storage capacitor Cap and may be configured to control a driving current flowing from the driving voltage line PL through the organic light-emitting diode OLED, according to a value of the voltage stored in the storage capacitor Cap. An opposite electrode of the organic light-emitting diode OLED may be connected to a common voltage ELVSS. The organic light-emitting diode OLED may display an image by emitting light having a certain brightness according to the driving current.

It is described with reference to FIG. 3 that the pixel circuit PC includes two thin-film transistors and one storage capacitor. However, embodiments are not limited thereto. For example, the pixel circuit PC may include three or more thin-film transistors and/or two or more storage capacitors. According to an embodiment, the pixel circuit PC may include seven thin-film transistors and one storage capacitor. The number of thin-film transistors and the number of storage capacitors may be variously modified according to a design of the pixel circuit PC. However, hereinafter, for convenience of description, a case where the pixel circuit PC includes two thin-film transistors and one storage capacitor will be described.

Figure 4:
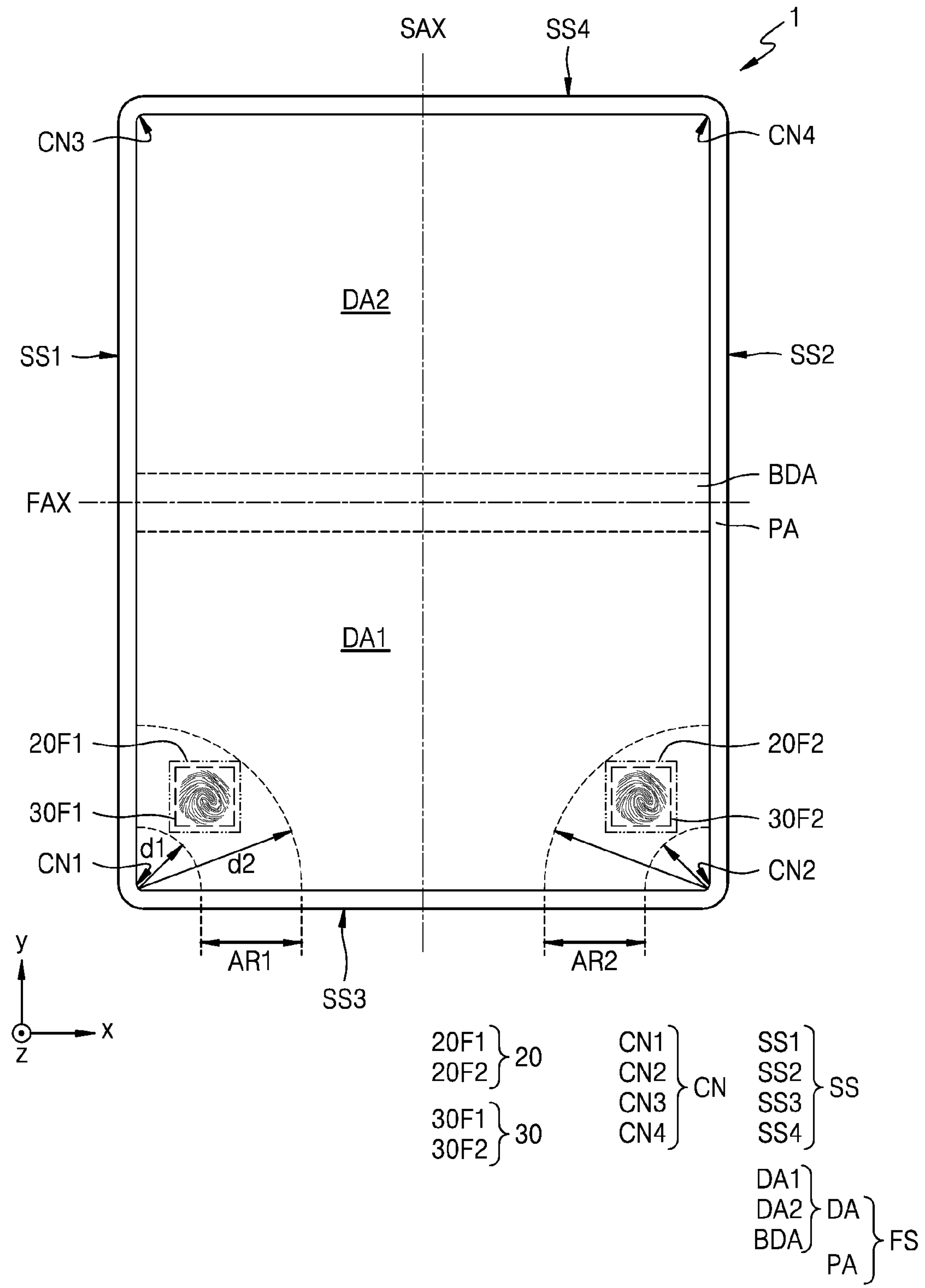
FIG. 4 is a schematic plan view of the display apparatus of FIG. 1A.

FIG. 4 is a schematic plan view of the display apparatus 1 according to an embodiment. The components that are the same or substantially the same as described above with reference to FIGS. 1A, 1B, and 1C are referred to by using the same reference numerals, and thus, repeated descriptions are not given.

Referring to FIG. 4, the display apparatus 1 may include at least two sensor portions 20 configured to provide a fingerprint recognition area 30 to at least one of the front surface FS and the side surface SS of the display apparatus 1. The sensor portions 20 may be configured to obtain a biometric image, for example, a fingerprint image. For example, the sensor portions 20 may be embedded in the display apparatus 1, and may be, for example, fixed in predetermined locations of the lower cover LC (see FIG. 1A) of the display apparatus 1. The locations of the sensor portions 20 embedded in the display apparatus 1 are illustrated by using alternate long and two short dashes lines in FIG. 4.

According to an embodiment, the at least two sensor portions 20 may include a first sensor portion in the form of a first front surface sensor portion 20F1 and a second sensor portion in the form of a second front surface sensor portion 20F2 that are apart from each other in a plan view. Here, the expression "in a plan view" denotes that the display apparatus 1 is viewed in a direction substantially perpendicular to the front surface FS of the display apparatus 1. Each of the first front surface sensor portion 20F1 and the second front surface sensor portion 20F2 may be located below the display panel 10 (see FIG. 1A) of the display apparatus 1 to overlap the display panel 10 and may include, for example, an optical or ultrasonic fingerprint recognition sensor.

Each of the first front surface sensor portion 20F1 and the second front surface sensor portion 20F2 may provide the fingerprint recognition area 30 to the display area DA of the front surface FS of the display apparatus 1. For example, the first front surface sensor portion 20F1 and the second front surface sensor portion 20F2 may respectively provide a first front surface fingerprint recognition area 30F1 and a second front surface fingerprint recognition area 30F2 to the display area DA. The first and second front surface fingerprint recognition areas 30F1 and 30F2 may overlap the first and second front surface sensor portions 20F1 and 20F2, respectively, in a plan view. According to an embodiment, the display area DA of the display apparatus 1 may display a predetermined mark, for example, a human fingerprint mark, on the first and second front surface fingerprint recognition areas 30F1 and 30F2. Thus, a user may see the displayed fingerprint mark and may contact the fingerprint recognition area 30 with the finger of the user.

According to an embodiment, the fingerprint recognition area 30 provided by the at least two sensor portions 20 may have any one shape from among a circular shape, an oval shape, and a square shape. For example, FIG. 4 illustrates that the fingerprint recognition area 30 has a square shape. However, the fingerprint recognition area 30 may also have a circular shape or an oval shape. Hereinafter, for convenience of description and illustration, a case in which the fingerprint recognition area 30 has a square shape is described.

According to an embodiment, each of the first front surface sensor portion 20F1 and the second front surface sensor portion 20F2 may be arranged, in a plan view, to be apart from a corner CN of the display area DA by a predetermined distance. The corner CN of the display area DA may be a portion formed with edges contacting each other. For example, the edges may define a planar shape of the display area. For example, as illustrated in FIG. 4, when the display area DA generally has a rectangular shape, the display area DA may include four corners CN1, CN2, CN3, and CN4. Each of the four corners CN1, CN2, CN3, and CN4 may have a rectangular or round shape. The distance between the corner CN and each of the at least two sensor portions 20 may be defined as a shortest distance between a point of the corner CN and the center of each of the at least two sensor portions 20.

For example, the center of the first front surface sensor portion 20F1 and the center of the second front surface sensor portion 20F2 may be respectively apart, in a plan view, from the first corner CN1 and the second corner CN2 of the display area DA by 20 mm to 100 mm. For example, a minimum distance d1 between the center of the first front surface sensor portion 20F1 and the first corner CN1 may be about 20 mm, and a maximum distance d2 between the center of the first front surface sensor portion 20F1 and the first corner CN1 may be about 100 mm. Thus, the center of the first front surface sensor portion 20F1 may be located in a first area AR1 between two arcs, radii of which correspond to the minimum distance d1 and the maximum distance d2, respectively, based on the first corner CN1. Similarly, a minimum distance d1 between the center of the second front surface sensor portion 20F2 and the second corner CN2 may be about 20 mm, and a maximum distance d2 between the center of the second front surface sensor portion 20F2 and the second corner CN2 may be about 100 mm. Thus, the center of the second front surface sensor portion 20F2 may be located in a second area AR2 between two arcs, radii of which correspond to the minimum distance d1 and the maximum distance d2, respectively, based on the second corner CN2.

According to an embodiment, the first front surface sensor portion 20F1 and the second front surface sensor portion 20F2 may be located on the same side based on the folding axis FAX, in a plan view. For example, as illustrated in FIG. 4, both of the first front surface sensor portion 20F1 and the second front surface sensor portion 20F2 may be located in the first display area DA1.

According to an embodiment, the first front surface sensor portion 20F1 and the second front surface sensor portion 20F2 may be substantially symmetrically located based on a symmetrical axis SAX crossing a central portion of the display area DA, in a plan view. For example, the symmetrical axis SAX may extend in a second direction (for example, a y-axis direction) and may cross the folding axis FAX.

Figure 5:
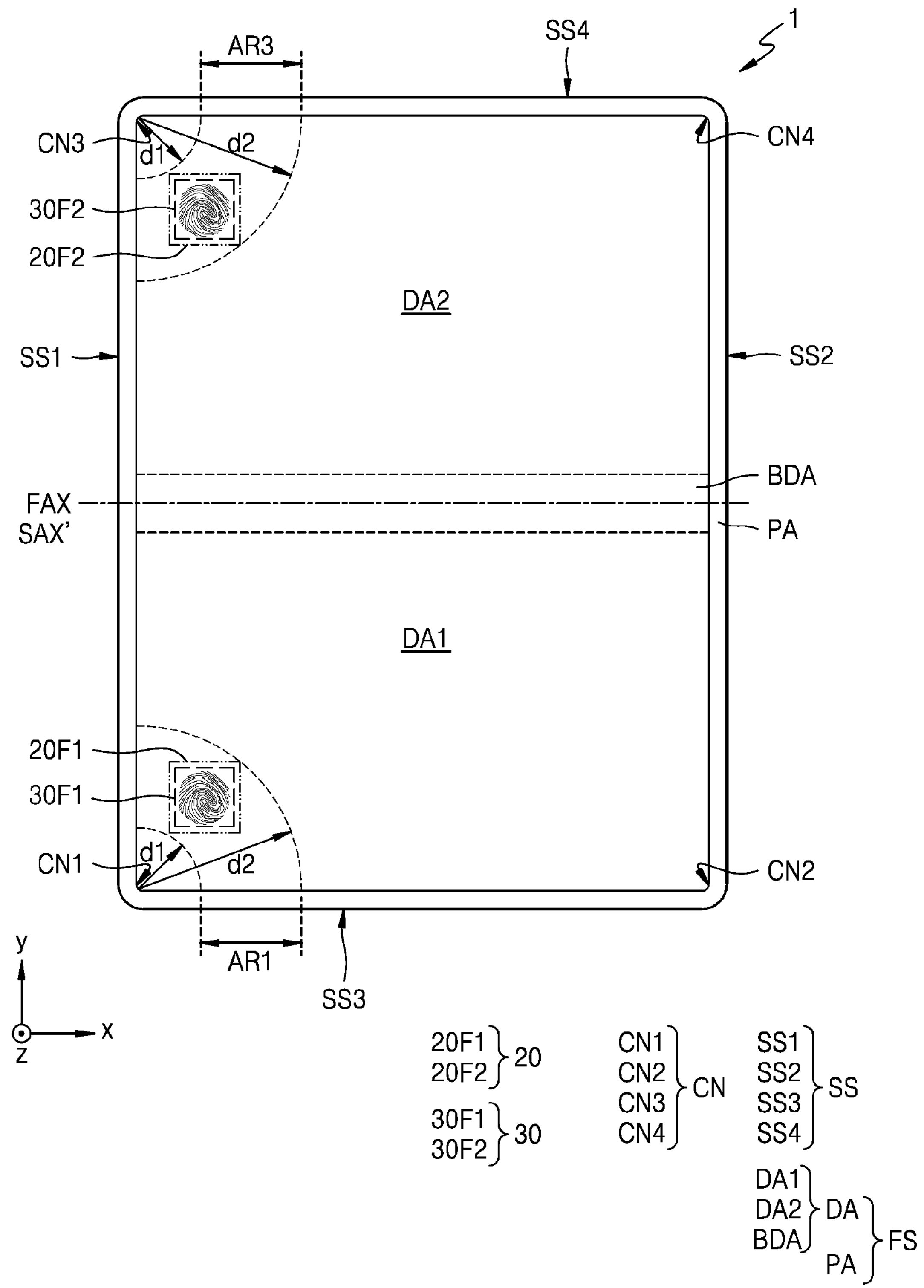
FIG. 5 is a schematic plan view of another embodiment of the display apparatus of FIG. 1A.

FIG. 5 is a schematic plan view of the display apparatus 1 according to another embodiment. The same aspects as described above with reference to FIG. 4 are not repeatedly described for descriptive convenience. Hereinafter, different aspects are mainly described.

Referring to FIG. 5, the first front surface sensor portion 20F1 and the second front surface sensor portion 20F2 may be located on opposite sides to each other based on the folding axis FAX in a plan view. For example, as illustrated in FIG. 5, while the first front surface sensor portion 20F1 may be located in the first display area DA1, the second front surface sensor portion 20F2 may be located in the second display area DA2.

In this case, the center of the second front surface sensor portion 20F2 may be apart from the third corner CN3 of the display area DA by 20 mm to 100 mm. For example, a minimum distance d1 between the center of the second front surface sensor portion 20F2 and the third corner CN3 may be about 20 mm, and a maximum distance d2 between the center of the second front surface sensor portion 20F2 and the third corner CN3 may be about 100 mm. Thus, the center of the second front surface sensor portion 20F2 may be located in a third area AR3 between two arcs. For example, radii of the two arcs correspond to the minimum distance d1 and the maximum distance d2, respectively, based on the third corner CN3.

According to an embodiment, the first front surface sensor portion 20F1 and the second front surface sensor portion 20F2 may be substantially symmetrically located in a plan view based on a symmetrical axis SAX' crossing a central portion of the display area DA, wherein the symmetrical axis SAX' may extend in a first direction (for example, an x-axis direction) and may correspond to the folding axis FAX.

As described above, the locations of the first and second front surface sensor portions 20F1 and 20F2 may be modified according to a location of the display apparatus 1, at which a user grips the display apparatus 1. For example, there may be four front surface sensor portions. In this case, the four front surface sensor portions may be respectively apart from the first, second, third, and fourth corners CN1, CN2, CN3, and CN4 of the display area DA by a predetermined distance.

Figure 6A:
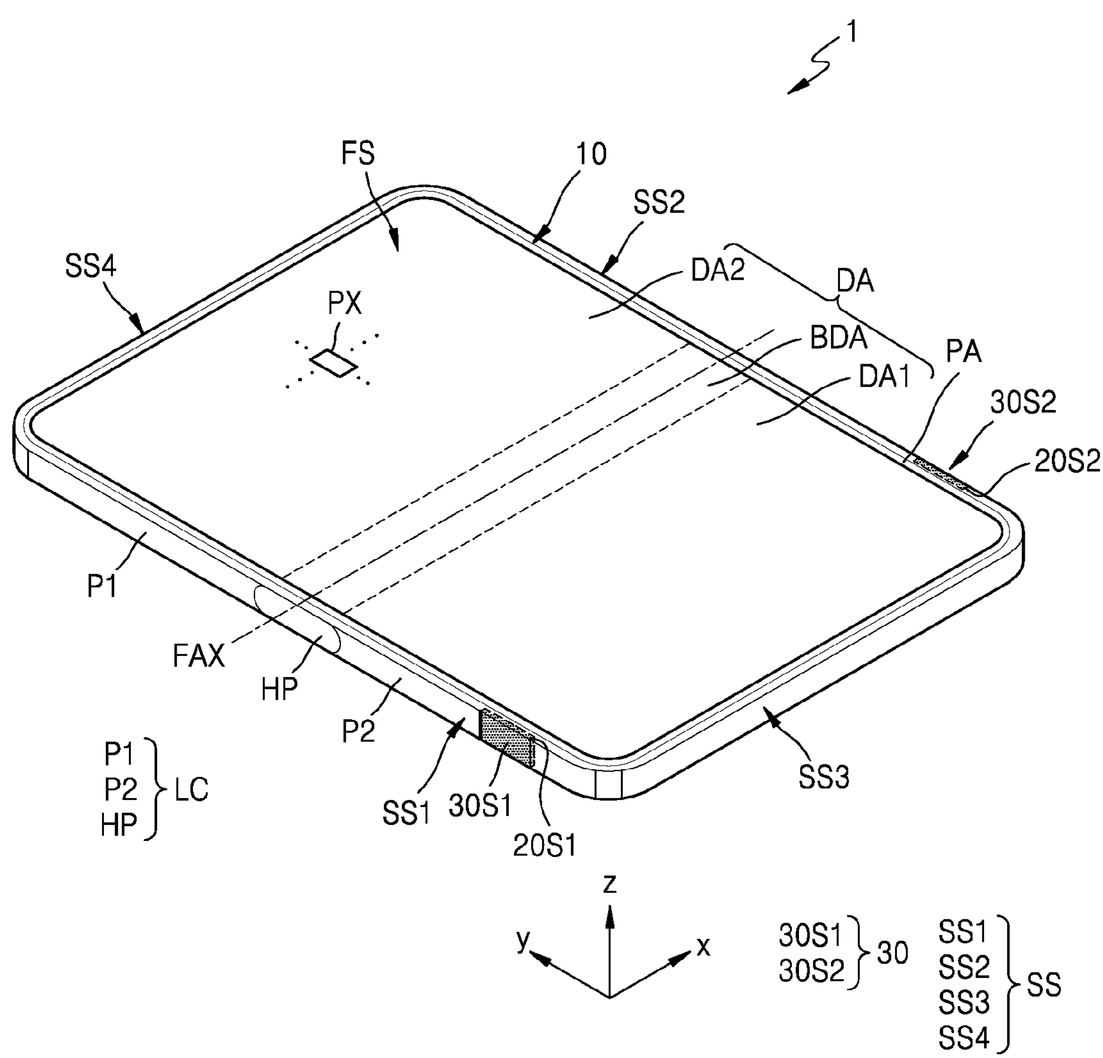
FIGS. 6A and 6B are respectively a schematic perspective view and a schematic plan view of another embodiment of the display apparatus of FIG. 1A.
Figure 6B:
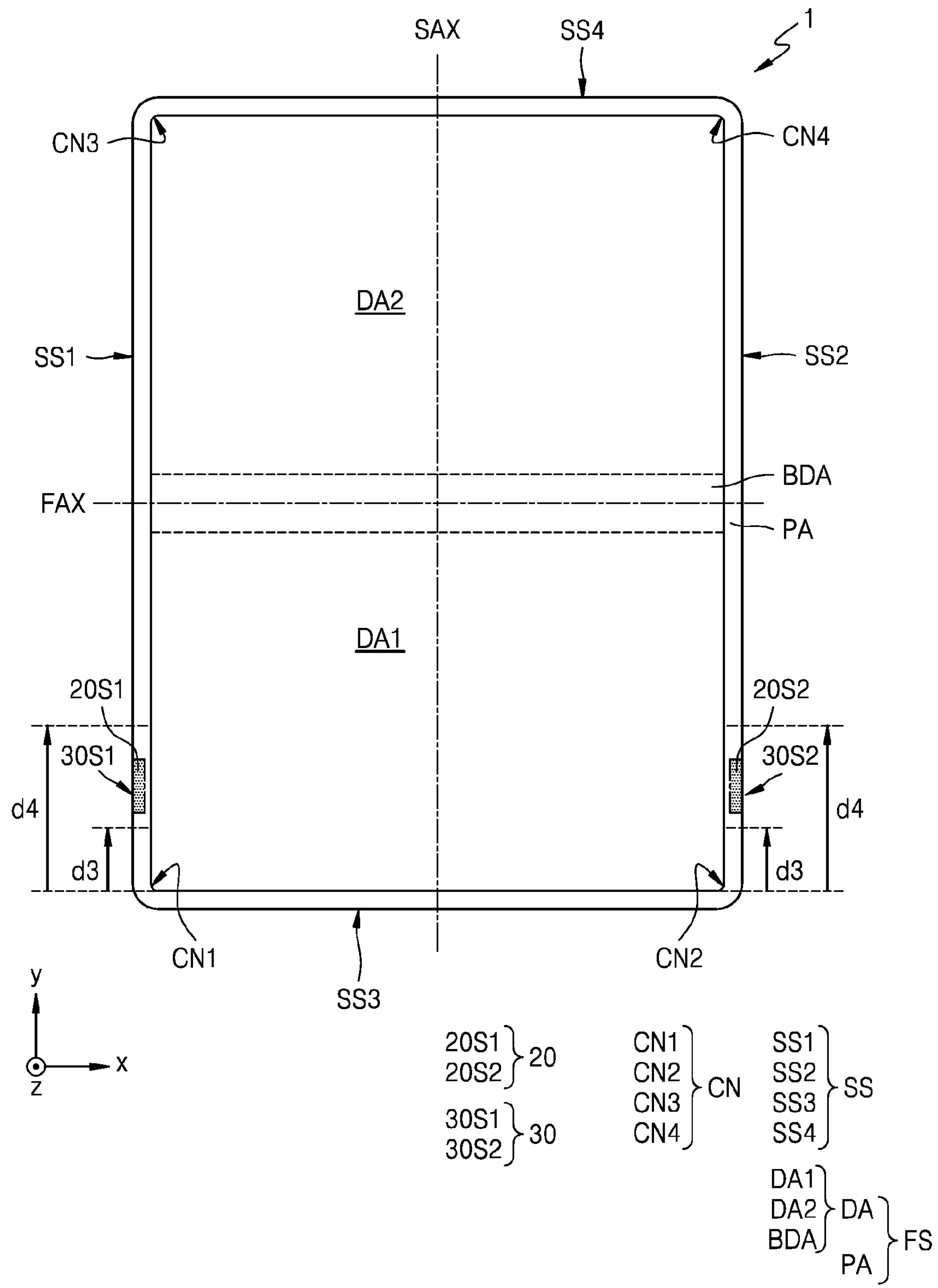

FIGS. 6A and 6B are respectively a schematic perspective view and a schematic plan view of the display apparatus 1 according to another embodiment. The components that are the same or substantially the same as described above with reference to FIGS. 1A, 1B, and 1C are referred to by using the same reference numerals, and thus, repeated descriptions are not given for descriptive convenience.

Referring to FIGS. 6A and 6B, the display apparatus 1 may include the sensor portions 20 providing the fingerprint recognition area 30 to the side surface SS of the display apparatus 1. For example, the display apparatus 1 may include a first lateral sensor portion in the form of a first side surface sensor portion 20S1 providing a first lateral fingerprint recognition area in the form of a first side surface fingerprint recognition area 30S1 to the first side surface SS1 of the display apparatus 1 and a second lateral sensor portion in the form of a second side surface sensor portion 20S2 providing a second lateral fingerprint recognition area in the form of a second side surface fingerprint recognition area 30S2 to the second side surface SS2 of the display apparatus 1. For example, the first side surface SS1 and the second side surface SS2 face in opposite directions to each other. For example, the arrangement of the second side surface fingerprint recognition area 30S2 and the second side surface sensor portion 20S2 may be easily understood by referring to FIG. 6B. The first side surface sensor portion 20S1 and the second side surface sensor portion 20S2 may include, for example, a capacitive type fingerprint recognition sensor, an area type fingerprint recognition sensor, or a swipe type fingerprint recognition sensor.

According to an embodiment, the center of each of the first side surface sensor portion 20S1 and the second side surface sensor portion 20S2 may be apart from the corner CN of the display area DA by a predetermined distance. For example, the center of the first side surface sensor portion 20S1 may be apart from the first corner CN1 of the display area DA in a second direction (for example, a y-axis direction) by 20 mm to 100 mm. For example, a minimum distance d3 between the center of the first side surface sensor portion 20S1 and the first corner CN1 in the second direction may be about 20 mm, and a maximum distance d4 between the center of the first side surface sensor portion 20S1 and the first corner CN1 in the second direction may be about 100 mm.

Similarly, the center of the second side surface sensor portion 20S2 may be apart from the second corner CN2 of the display area DA in the second direction by 20 mm to 100 mm. For example, a minimum distance d3 between the center of the second side surface sensor portion 20S2 and the second corner CN2 in the second direction may be about 20 mm, and a maximum distance d4 between the center of the second side surface sensor portion 20S2 and the second corner CN2 in the second direction may be about 100 mm.

According to an embodiment, the first side surface sensor portion 20S1 and the second side surface sensor portion 20S2 may be located on the same side based on a folding axis FAX, in a plan view. For example, the first side surface sensor portion 20S1 and the second side surface sensor portion 20S2 may be arranged on a side of the first display area DA1 based on the folding axis FAX and may be adjacent to the first display area DA1.

According to an embodiment, the first side surface sensor portion 20S1 and the second side surface sensor portion 20S2 may be substantially symmetrically located based on a symmetrical axis SAX crossing a central portion of the display area DA, in a plan view. For example, the symmetrical axis SAX may extend in a second direction (for example, a y-axis direction) and may cross the folding axis FAX.

Figure 7:
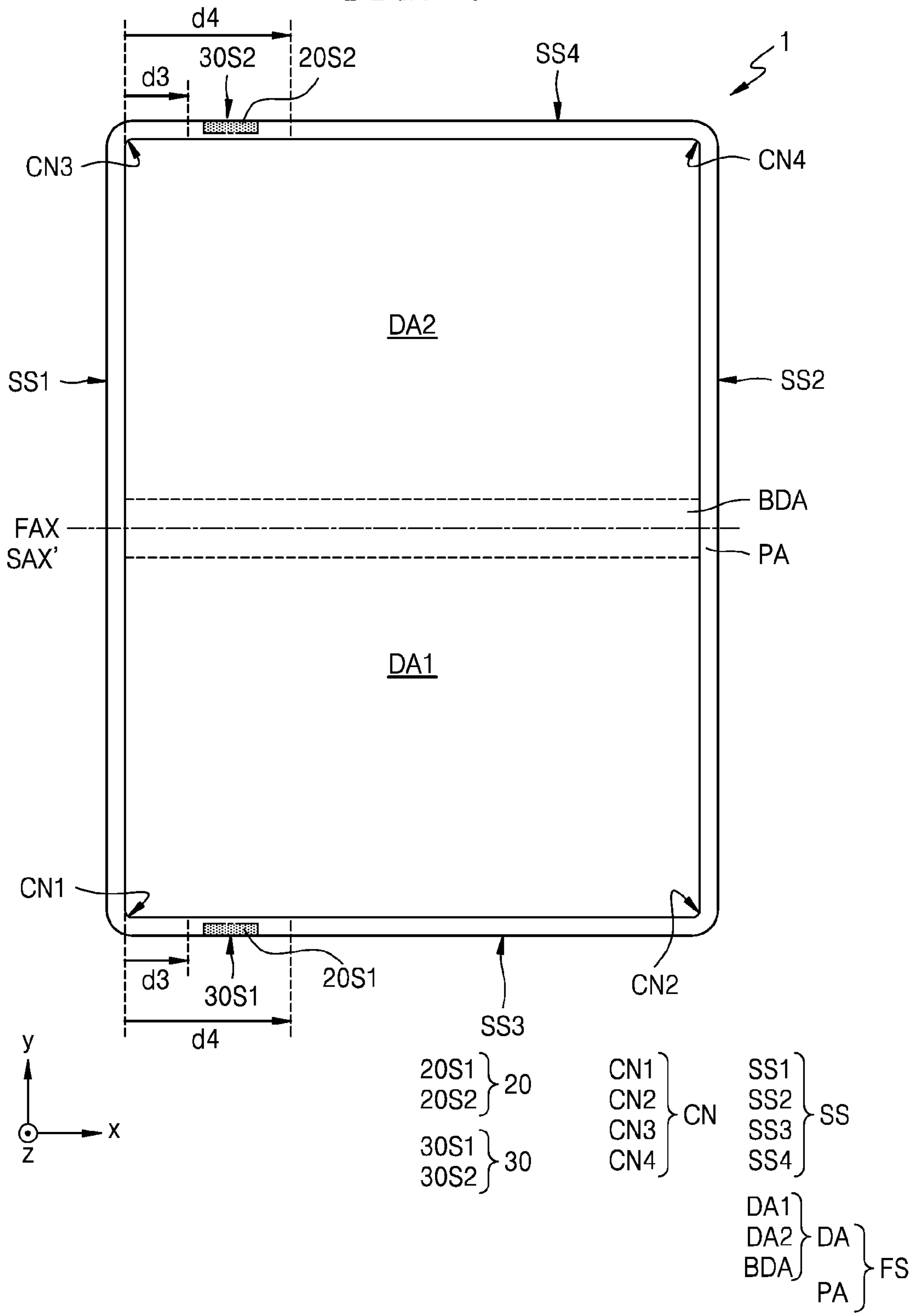
FIG. 7 is a schematic plan view of another embodiment of the display apparatus of FIG. 1A.

FIG. 7 is a schematic plan view of the display apparatus 1 according to another embodiment. The same aspects as described above with reference to FIGS. 6A and 6B are not repeatedly described. Hereinafter, different aspects are mainly described.

Referring to FIG. 7, the first side surface sensor portion 20S1 may provide the first side surface fingerprint recognition area 30S1 to the third side surface SS3 of the display apparatus 1, and the second side surface sensor portion 20S2 may provide the second side surface fingerprint recognition area 30S2 to the fourth side surface SS4 of the display apparatus 1. For example, the first side surface fingerprint recognition area 30S1 and the second side surface fingerprint recognition area 30S2 may be respectively located on the third side surface SS3 and the fourth side surface SS4 that are opposite to each other.

According to an embodiment, the center of the first side surface sensor portion 20S1 may be apart from the first corner CN1 of the display area DA in a first direction (for example, an x-axis direction) by 20 mm to 100 mm. For example, a minimum distance d3 between the center of the first side surface sensor portion 20S1 and the first corner CN1 in the first direction may be about 20 mm, and a maximum distance d4 between the center of the first side surface sensor portion 20S1 and the first corner CN1 in the first direction may be about 100 mm.

Similarly, the center of the second side surface sensor portion 20S2 may be apart from the third corner CN3 of the display area DA in the first direction by 20 mm to 100 mm. For example, a minimum distance d3 between the center of the second side surface sensor portion 20S2 and the third corner CN3 in the first direction may be about 20 mm, and a maximum distance d4 between the center of the second side surface sensor portion 20S2 and the third corner CN3 in the first direction may be about 100 mm.

In this case, the first side surface sensor portion 20S1 and the second side surface sensor portion 20S2 may be located on opposite sides to each other based on a folding axis FAX, in a plan view. For example, while the first side surface sensor portion 20S1 may be located, based on the folding axis FAX, on a side at which the first display area DA1 is arranged, the second side surface sensor portion 20S2 may be located, based on the folding axis FAX, on a side at which the second display area DA2 is arranged. For example, the first side surface sensor portion 20S1 may be adjacent to the first display area DA1. However, the second side surface sensor portion 20S2 may be adjacent to the second display area DA2.

According to an embodiment, the first side surface sensor portion 20S1 and the second side surface sensor portion 20S2 may substantially symmetrically located in a plan view based on a symmetrical axis SAX' crossing a central portion of the display area DA, wherein the symmetrical axis SAX' may extend in the first direction (for example, the x-axis direction) and may correspond to the folding axis FAX.

As described above, the locations of the first and second side surface sensor portions 20S1 and 20S2 may be modified according to a location of the display apparatus 1, at which a user grips the display apparatus 1.

Various embodiments described above with reference to FIGS. 4, 5, 6A, 6B, and 7 may be combined with one another. For example, the display apparatus 1 may include not only the first front surface sensor portion 20F1 and the second front surface sensor portion 20F2 illustrated in FIG. 4, but also the first side surface sensor portion 20S1 and the second side surface sensor portion 20S2 illustrated in FIG. 6B.

Figure 8A:
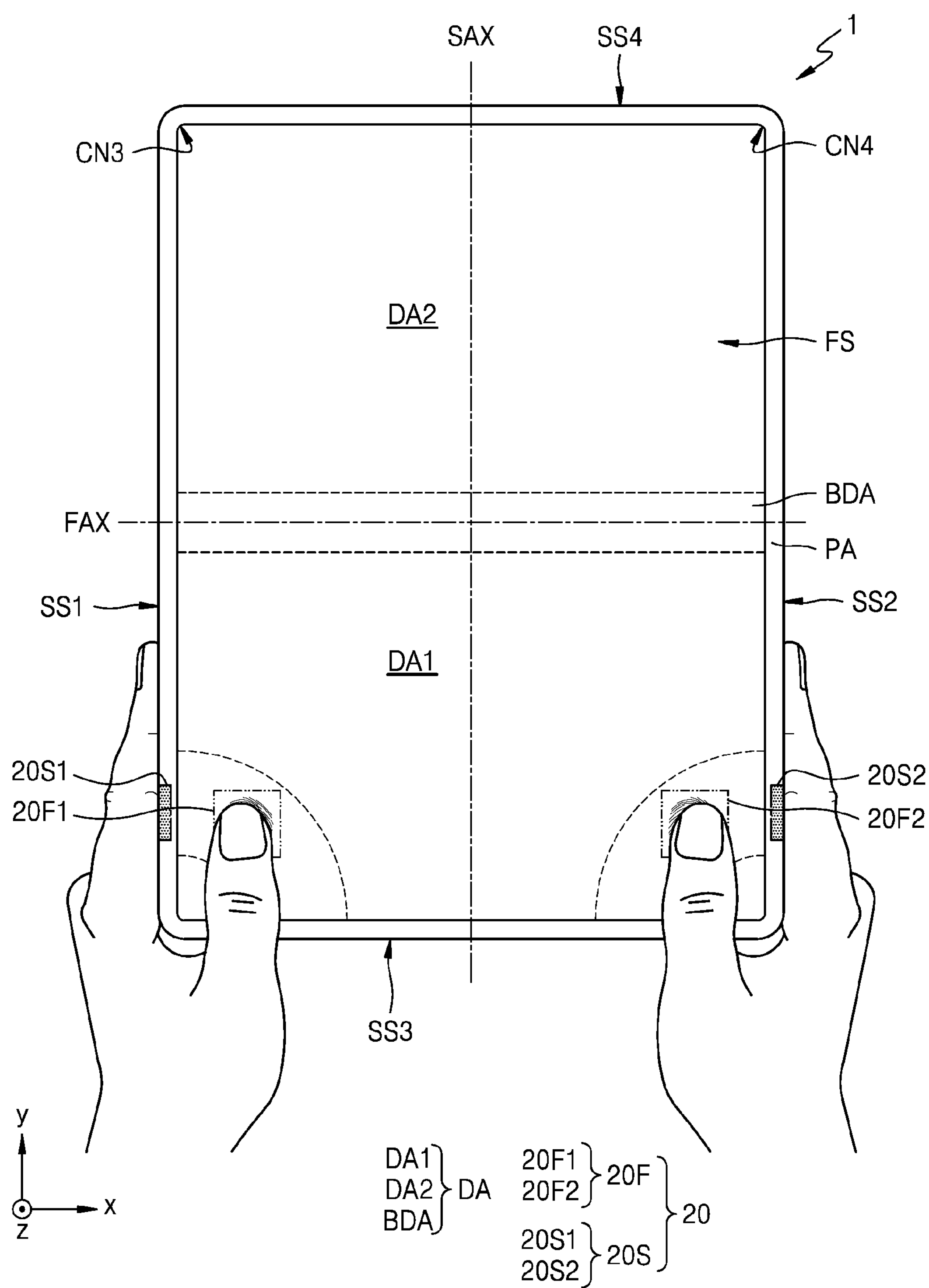
FIGS. 8A and 8B are schematic plan views of the display apparatus of FIG. 6A illustrating the usage thereof.
Figure 8B:
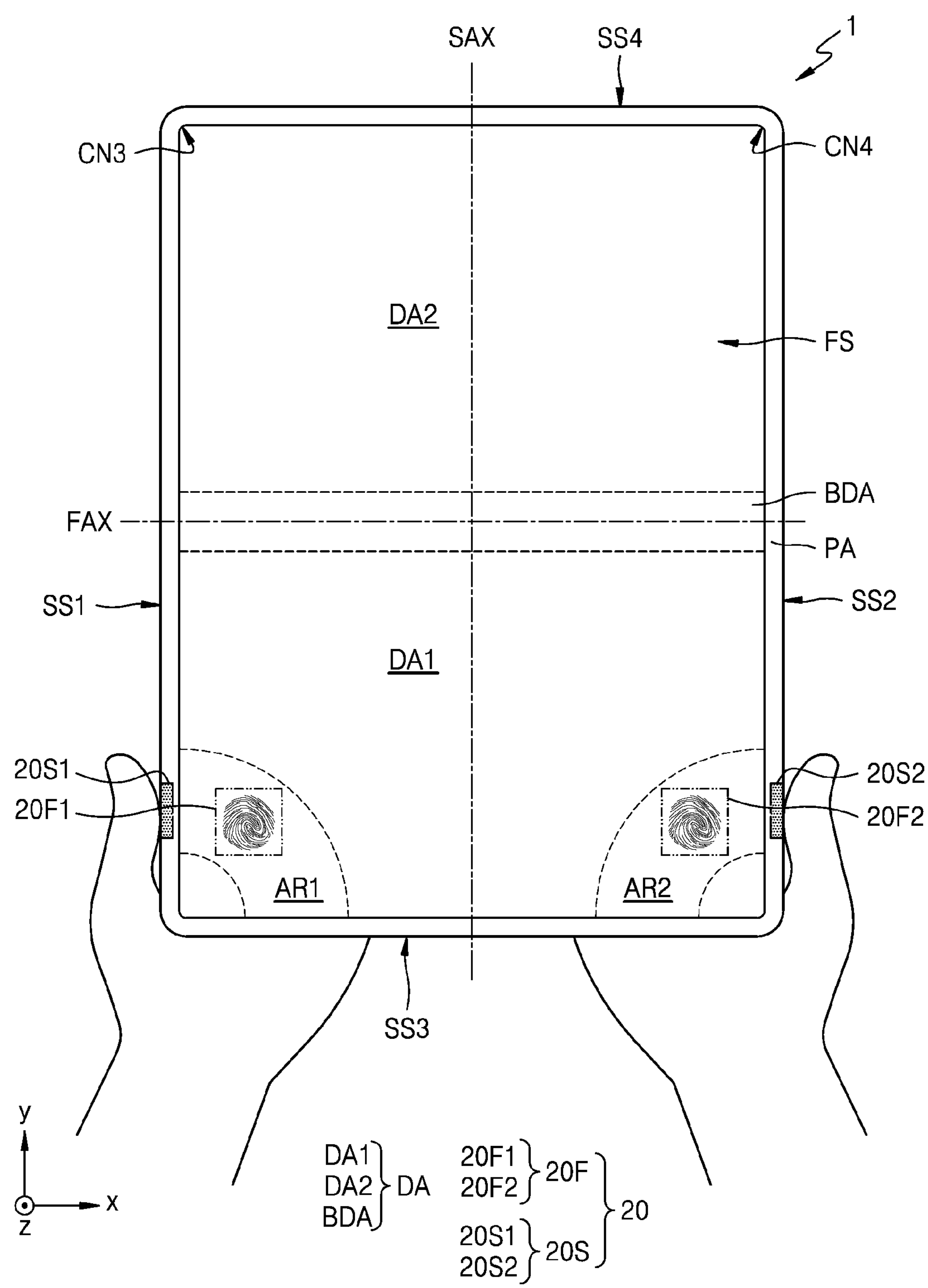

FIGS. 8A and 8B are schematic plan views of the display apparatus 1 during use, according to an embodiment. The components that are the same or substantially the same as described above with reference to FIGS. 1A, 1B, and 1C are referred to by using the same reference numerals, and thus, repeated descriptions are not given for descriptive convenience.

Referring to FIGS. 8A and 8B, a user of the display apparatus 1 may grip the display apparatus 1 which is in an unfolded state. For example, the user may grip the display apparatus 1 by using both hands. Generally, when the display apparatus 1 is gripped by using both hands, thumbs of the user may be laid on a portion of the display area DA (for example, the first display area DA1), of the front surface FS of the display apparatus 1, as illustrated in FIG. 8A. Alternatively, as illustrated in FIG. 8B, the thumbs of the user may be laid on the side surface SS of the display apparatus 1, for example, the first side surface SS1 and the second side surface SS2.

Locations of the at least two sensor portions 20 of the display apparatus 1 according to embodiments may be determined by taking into account such locations of the thumbs of the user. By arranging the sensor portions 20 in an area in which thumbs of a user are naturally located, a distance for moving the thumbs when the user unlocks a display apparatus or inputs a fingerprint instead of a password, may be minimized. Thus, the use convenience of the display apparatus 1 may be increased.

According to an embodiment, the display apparatus 1 may include not only the first front surface sensor portion 20F1 and the second front surface sensor portion 20F2 located in the first display area DA1, but also the first side surface sensor portion 20S1 and the second side surface sensor portion 20S2 located on the first side surface SS1 and the second side surface SS2, respectively. When a user is to input a fingerprint, the at least two sensor portions 20 may recognize the fingerprint. For example, when the user is to input a fingerprint in an unfolded state of the display apparatus 1, a fingerprint of a left thumb of the user may be input through the first front surface sensor portion 20F1 or the first side surface sensor portion 20S1, and a fingerprint of a right thumb of the user may be input through the second front surface sensor portion 20F2 or the second side surface sensor portion 20S2. For example, when the user is to input a fingerprint in a folded state of the display apparatus 1, the fingerprints of the left thumb and the right thumb of the user may be input through the first side surface sensor portion 20S1 and the second side surface sensor portion 20S2, respectively. As described above, the fingerprint may be input through the at least two sensor portions 20. Thus, the security of the display apparatus 1 may be enhanced.

As described above, when the at least two sensor portions 20 provide the fingerprint recognition area 30 to the display area DA of the front surface FS, the display area DA may display a fingerprint mark on the fingerprint recognition area 30. Here, a location of the fingerprint mark may be changed in the fingerprint recognition area 30, and the location of the fingerprint mark may be changed based on information about a size and a location of a fingerprint of a user recognized by the at least two sensor portions 20.

For example, the first front surface sensor portion 20F1 may be provided to provide the fingerprint recognition area 30 throughout the first area AR1 illustrated in FIG. 8B, and in this case, the first area AR1 may be a front surface fingerprint recognition area. Here, the first display area DA1 may mark a fingerprint mark on a region of the first area AR1. A size of a fingerprint and a size of a hand or a finger may be different according to a user. Also, a location on which the fingerprint is input may be frequently changed. Thus, the display apparatus 1 may collect information about the size of the fingerprint of the user and the location on which the fingerprint is input and may change a location of the fingerprint mark based on the collected information. As described above, by optimizing the location of the fingerprint mark according to each user, the use convenience of the display apparatus 1 may be enhanced. These characteristics may be similarly applied to the second front surface sensor portion 20F2 and the second area AR2.

Figure 9:
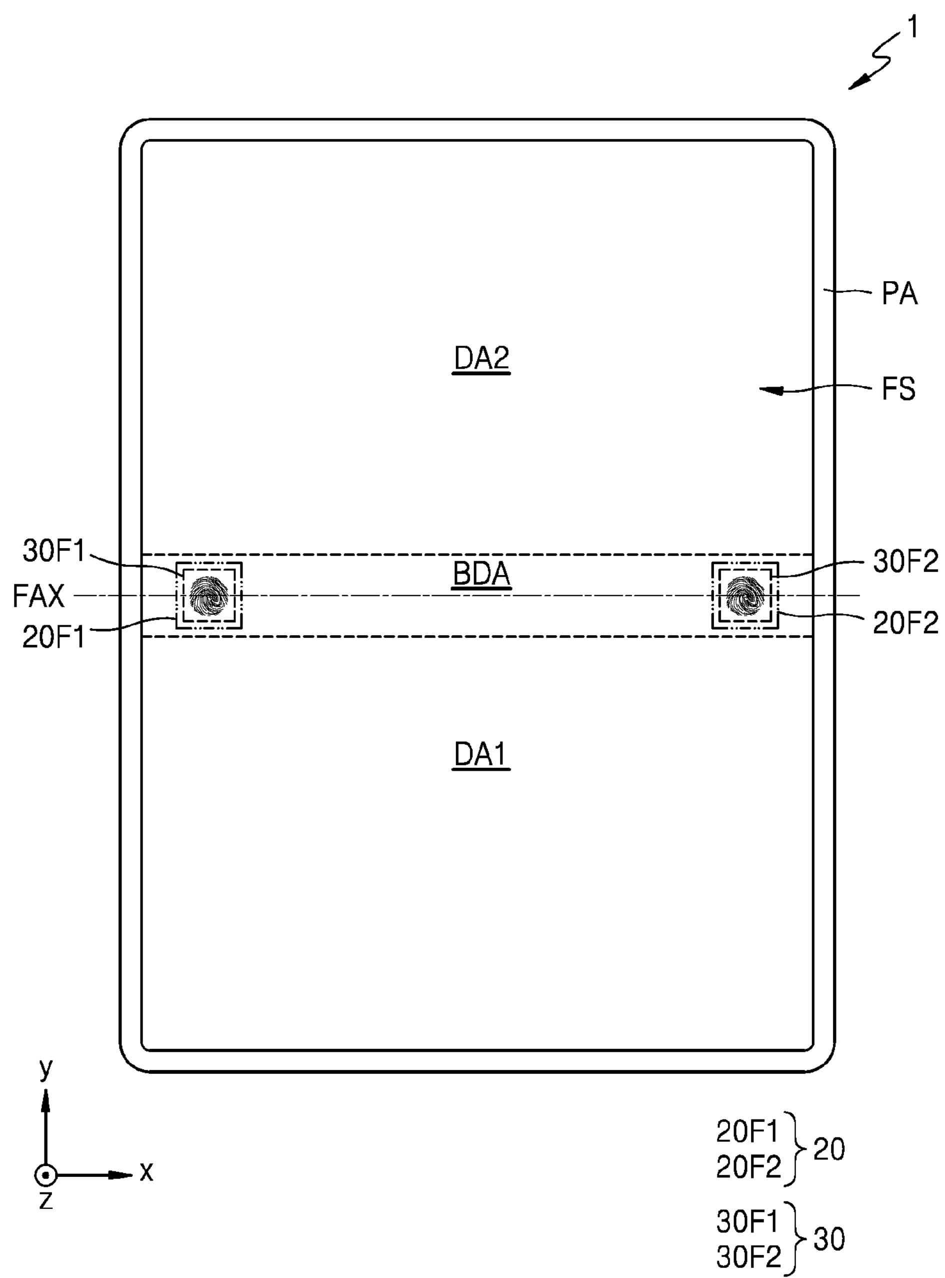
FIG. 9 is a schematic plan view of another embodiment of the display apparatus of FIG. 1A.

FIG. 9 is a schematic plan view of the display apparatus 1 according to another embodiment.

Referring to FIG. 9, the display apparatus 1 may include the display area DA, and the display area DA may include the bending display area BDA overlapping a folding axis FAX and extending in a first direction (for example, an x-axis direction), a first display area DA1 and a second display area DA2 at both sides of the bending display area BDA with the bending display area BDA therebetween. The first display area DA1 and the second display area DA2 may be apart from each other in a second direction (for example, a y-axis direction) crossing the first direction.

According to an embodiment, the display apparatus 1 may include the first front surface sensor portion 20F1 and the second front surface sensor portion 20F2 configured to provide, to the bending display area BDA, different fingerprint recognition areas from each other. For example, the first front surface sensor portion 20F1 may provide the first front surface fingerprint recognition area 30F1, and the second front surface sensor portion 20F2 may provide the second front surface fingerprint recognition area 30F2. The first front surface sensor portion 20F1 and the second front surface sensor portion 20F2 may be apart from each other in the first direction (for example, the x-axis direction), which is the direction in which the bending display area BDA may extend, and may be arranged to be adjacent to both ends of the bending display area BDA.

According to an embodiment, in a state in which the display apparatus 1 is partially folded, a user may input a fingerprint of a finger through the first front surface sensor portion 20F1 and the second front surface sensor portion 20F2. In this case, the fingerprint of the finger of the user may be recognized in a state in which the first and second front surface fingerprint recognition areas 30F1 and 30F2 may be bent to cover the finger of the user, and thus, an increased area of the fingerprint may be recognized. Thus, the security of the display apparatus 1 may be enhanced.

Figure 10A:
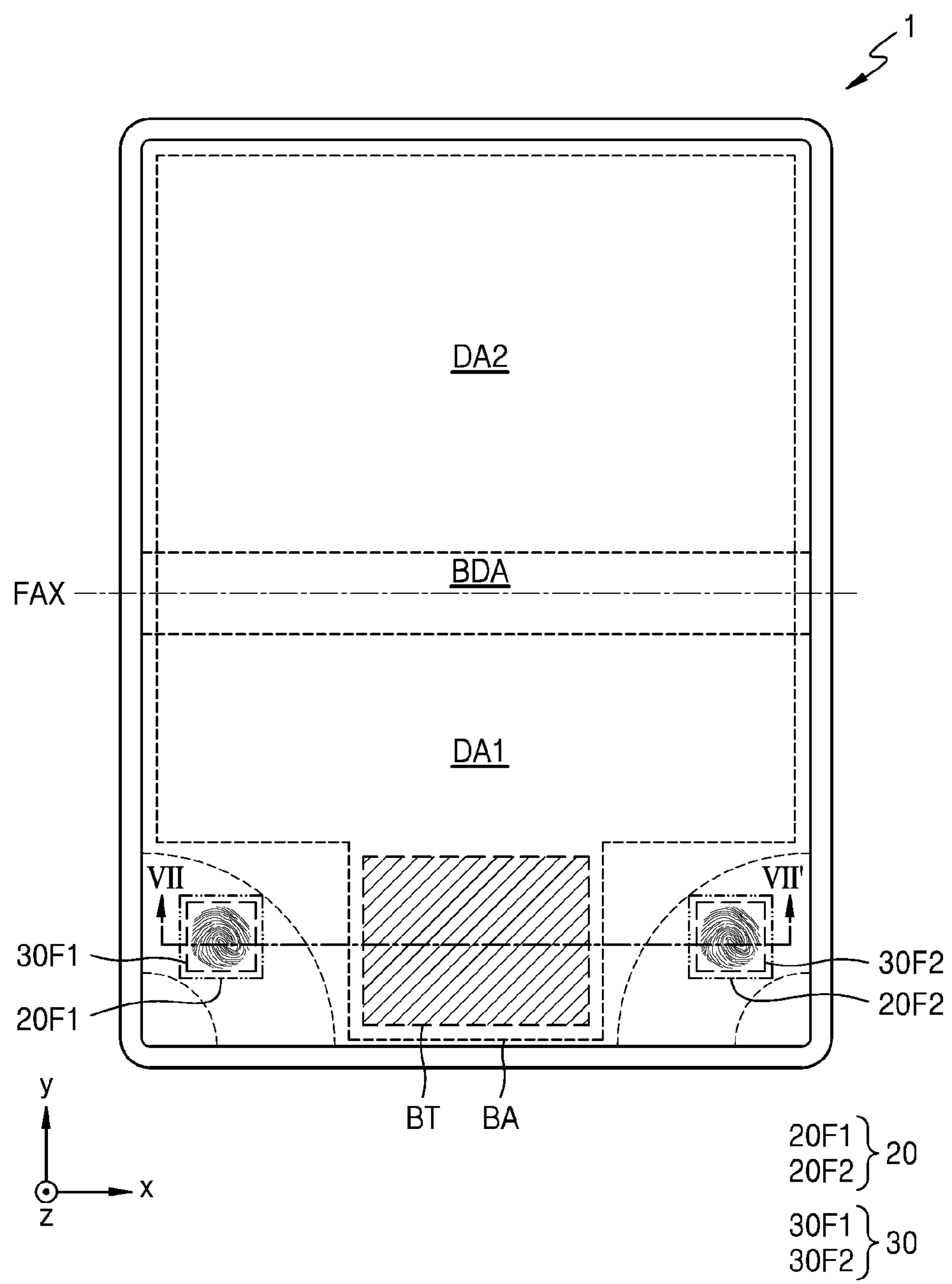
FIGS. 10A and 10B are respectively a schematic plan view and a schematic cross-sectional view of another embodiment of the display apparatus of FIG. 1A.
Figure 10B:
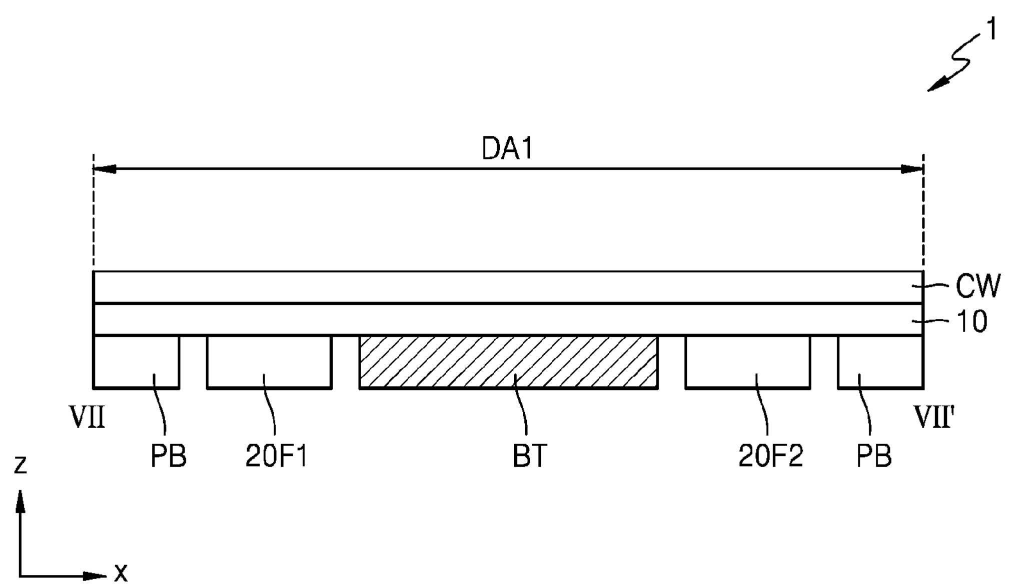

FIGS. 10A and 10B are respectively a schematic plan view and a schematic cross-sectional view of the display apparatus 1 according to another embodiment. The components that are the same or substantially the same as described above with reference to FIG. 4 are referred to by using the same reference numerals in FIG. 10A, and thus, repeated descriptions are not given for descriptive convenience. FIG. 10B may correspond to a cross-section of the display apparatus 1, taken along line VII-VII' of FIG. 10A.

Referring to FIGS. 10A and 10B, the display apparatus 1 may further include a battery module BT. The batter module BT may be embedded in the display apparatus 1 and may be electrically connected to the display panel 10 and various components included in the display apparatus 1. The battery module BT may supply power for driving the display apparatus 1.

According to an embodiment, the battery module BT may be arranged not to overlap the sensor portions 20 in a plan view. 10A illustrates an area BA in which the battery module BT may be arranged. For example, the battery module BT may be arranged between the first front surface sensor portion 20F1 and the second front surface sensor portion 20F2 in a plan view, as illustrated in FIG. 10A.

Referring to FIG. 10B, the display apparatus 1 may include the display panel 10, the cover window CW above the display panel 10, and the lower protection layer PB below the display panel 10.

The cover window CW may cover the display panel 10 and protect the display panel 10 from external shocks. For example, the cover window CW may have sufficient rigidity and hardness. Also, the cover window CW may have a high light transmittance to transmit light emitted from the display panel 10 and a sufficiently small thickness to minimize a weight of the display apparatus 1. For example, the cover window CW may include glass or plastic. For example, the cover window CW may include ultra-thin strengthened glass having a strength intensified via chemical tempering, thermal tempering, or the like. The cover window CW may be folded or bent via an external force, without cracks, etc. occurring.

The lower protection layer PB may protect the display panel 10 from the outside. The lower protection layer PB may absorb physical shocks from the outside and prevent the penetration of impurities, moisture, etc. into the display panel 10. According to an embodiment, the lower protection layer PB may include an organic insulating material, such as PET, PI, urethane acrylate, etc.

The sensor portions 20 and the battery module BT of the display apparatus 1 may be arranged below the display panel 10. As described above, the display apparatus 1 may include the at least two sensor portions 20, and the battery module BT may be arranged between the at least two sensor portions 20.

Figure 11:
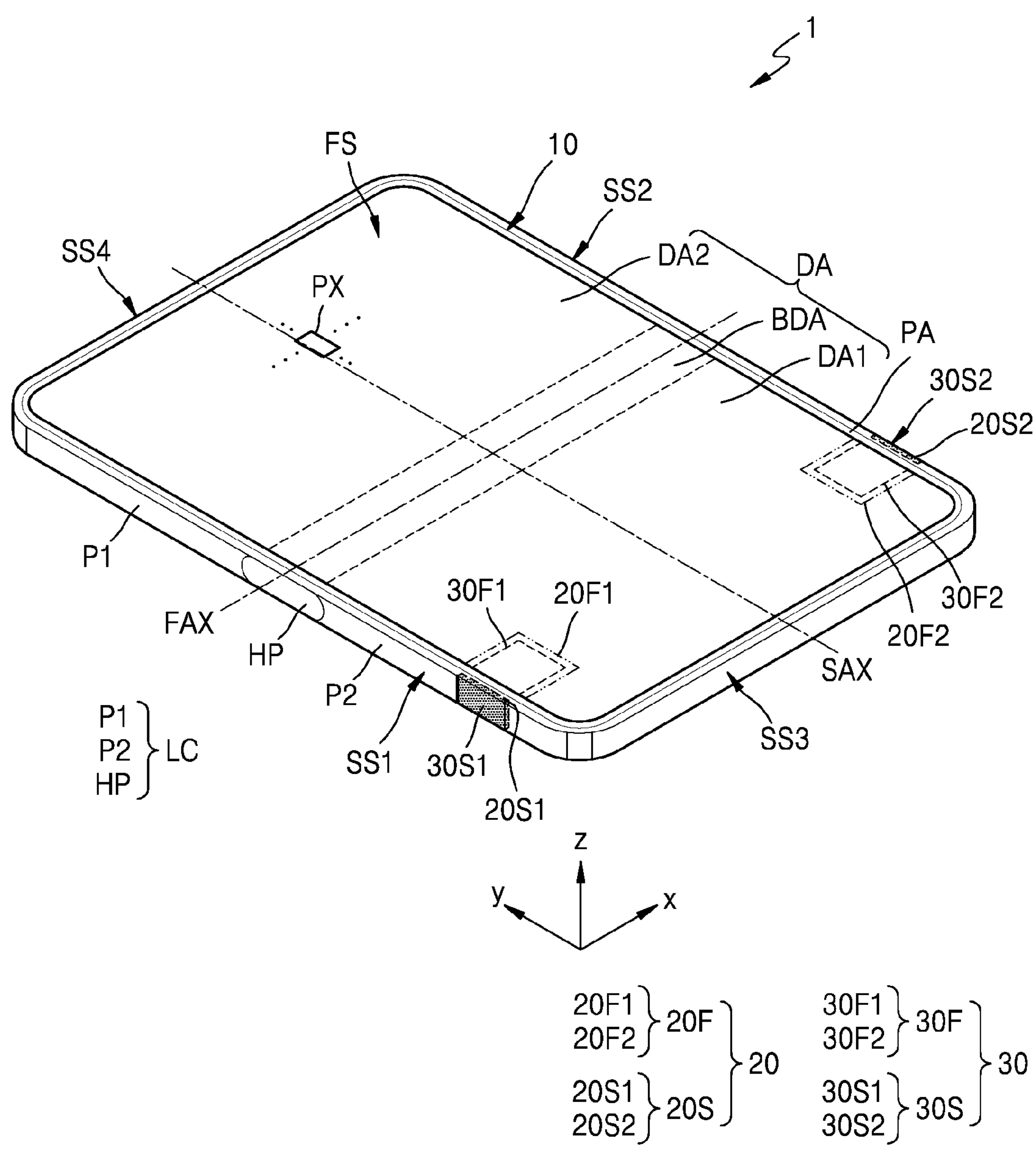
FIG. 11 is a schematic perspective view of another embodiment of the display apparatus of FIG. 1A.

FIG. 11 is a schematic perspective view of the display apparatus 1 according to another embodiment. The components that are the same or substantially the same as described above with reference to FIG. 4 are referred to by using the same reference numerals in FIG. 11, and thus, repeated descriptions are not given for descriptive convenience.

Referring to FIG. 11, the display apparatus 1 may include the at least two sensor portions 20, and the at least two sensor portions 20 may provide the fingerprint recognition area 30 to the front surface FS or the side surface SS of the display apparatus 1. For example, the display apparatus 1 may include a front surface sensor portion 20F configured to provide a front surface fingerprint recognition area 30F to the display area DA of the front surface FS of the display apparatus 1 and a side surface sensor portion 20S configured to provide a side surface fingerprint recognition area 30S to the side surface SS of the display apparatus 1. For example, the display apparatus 1 may include: the first front surface sensor portion 20F1 configured to provide the first front surface fingerprint recognition area 30F1 to the first display area DA1 and the second front surface sensor portion 20F2 configured to provide the second front surface fingerprint recognition area 30F2 to the first display area DA1; and the first side surface sensor portion 20S1 configured to provide the first side surface fingerprint recognition area 30S1 to the first side surface SS1 of the display apparatus 1 and the second side surface sensor portion 20S2 configured to provide the second side surface fingerprint recognition area 30S2 to the second side surface SS2 of the display apparatus 1.

According to an embodiment, the front surface fingerprint recognition area 30F and the side surface fingerprint recognition area 30S may be adjacent to each other. Here, the expression "being adjacent to each other" may denote that two fingerprint recognition areas may touch each other or may be apart from each other by a relatively small gap with respect to sizes of the fingerprint recognition areas. FIG. 11 illustrates an example in which the first front surface fingerprint recognition area 30F1 and the first side surface fingerprint recognition area 30S1 may be adjacent to each other and may be apart from each other by a width of the peripheral area PA. As another example, the first front surface fingerprint recognition area 30F1 and the first side surface fingerprint recognition area 30S1 may touch each other. The second front surface fingerprint recognition area 30F2 and the second side surface fingerprint recognition area 30S2 may be adjacent to each other. The second front surface fingerprint recognition area 30F2 and the second side surface fingerprint recognition area 30S2 may be understood to be substantially symmetrically arranged with the first front surface fingerprint recognition area 30F1 and the first side surface fingerprint recognition area 30S1, based on a symmetrical axis SAX.

As described above, by arranging corresponding pairs of the front surface fingerprint recognition area 30F and the side surface fingerprint recognition area 30S to be adjacent to each other, the two fingerprint recognition areas may recognize the fingerprint of a user. For example, each pair of the front surface fingerprint recognition area 30F and the side surface fingerprint recognition area 30S adjacent to each other may recognize portions of the fingerprint of a user. For example, the user may input the fingerprint by rolling a finger from a direction of the front surface fingerprint recognition area 30F to a direction of the side surface fingerprint recognition area 30S or vice versa. Accordingly, an increased area of the fingerprint may be recognized, and thus, the security of the display apparatus 1 may be enhanced.

The descriptions above are mainly given with respect to the display apparatus. However, embodiments are not limited thereto. In other words, a method of manufacturing the display apparatus may also be included in the scope of the embodiments.

As described above, according to the one or more of the above embodiments, a foldable display apparatus capable of recognizing a fingerprint of a user at a plurality of locations of the foldable display apparatus may be realized. In particular, a display apparatus which may enhance the use convenience and the security with respect to fingerprint recognition may be realized. However, the scope of the embodiments is not limited to the effect described above.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:

a first surface being foldable along a folding axis extending in a first direction, the first surface having a display area;

a second surface opposite to the first surface;

a side surface connecting the first surface and the second surface; and at least two sensor portions disposed in at least one of the first surface and the side surface, the at least two sensor portions configured to provide fingerprint recognition areas, wherein the at least two sensor portions comprise a first sensor portion and a second sensor portion spaced apart from the first sensor portion in a plan view, the first sensor portion and the second sensor portion configured to provide the fingerprint recognition areas to the display area of the first surface, and wherein, in a plan view, the first sensor portion and the second sensor portion are disposed on a same side with respect to the folding axis.

2. The display apparatus of claim 1, wherein, in a plan view, a center of the first sensor portion and a center of the second sensor portion are respectively spaced apart from a first corner and a second corner of the display area by about 20 mm to about 100 mm.

3. The display apparatus of claim 1, wherein, in a plan view, the first sensor portion and the second sensor portion are substantially symmetrically disposed with respect to a symmetrical axis crossing a central portion of the display area.

4. A display apparatus comprising:

a first surface being foldable along a folding axis extending in a first direction, the first surface having a display area;

a second surface opposite to the first surface;

a side surface connecting the first surface and the second surface; and at least two sensor portions disposed in at least one of the first surface and the side surface, the at least two sensor portions configured to provide fingerprint recognition areas, wherein the side surface of the display apparatus comprises a first side surface and a second side surface facing in opposite directions to each other, and wherein the at least two sensor portions comprise a first lateral sensor portion and a second lateral sensor portion, the first lateral sensor portion and the second lateral sensor portion configured to provide the fingerprint recognition areas to the first side surface and the second side surface, respectively.

5. The display apparatus of claim 4, wherein, in a plan view, a center of the first lateral sensor portion and a center of the second lateral sensor portion are respectively spaced apart from a first corner and a second corner of the display area by about 20 mm to about 100 mm.

6. The display apparatus of claim 4, wherein, in a plan view, the first lateral sensor portion and the second lateral sensor portion are disposed on a same side with respect to the folding axis.

7. The display apparatus of claim 4, wherein, in a plan view, the first lateral sensor portion and the second lateral sensor portion are disposed on opposite sides to each other with respect to the folding axis.

8. The display apparatus of claim 4, wherein, in a plan view, the first lateral sensor portion and the second lateral sensor portion are substantially symmetrically disposed with respect to a symmetrical axis crossing a central portion of the display area.

9. The display apparatus of claim 1, wherein the display area comprises a bending display area overlapping the folding axis and extending in the first direction, and a first display area and a second display area disposed at both sides of the bending display area with the bending display area between the first display area and the second display area, and the first sensor portion and the second sensor portion provide the fingerprint recognition areas that are different from each other to the bending display area.

10. The display apparatus of claim 1, further comprising a battery module arranged, in a plan view, between the first sensor portion and the second sensor portion.

11. The display apparatus of claim 1, wherein each of the fingerprint recognition areas provided by the at least two sensor portions has one of a circular shape, an oval shape, and a quadrangular shape.

12. The display apparatus of claim 1, wherein the at least two sensor portions comprise:

a first sensor portion configured to provide a first fingerprint recognition area to the display area of the first surface of the display apparatus; and a lateral sensor portion configured to provide a lateral fingerprint recognition area to the side surface of the display apparatus, wherein the first fingerprint recognition area and the lateral fingerprint recognition area are adjacent to each other.

13. The display apparatus of claim 1, wherein, when the at least two sensor portions are configured to provide the fingerprint recognition areas to the display area of the first surface of the display apparatus, the display area is configured to display a fingerprint mark on the fingerprint recognition areas.

14. The display apparatus of claim 13, wherein a location of the fingerprint mark is changed in each of the fingerprint recognition areas based on information about a size and a location of a fingerprint of a user that is recognized by the at least two sensor portions.

15. The display apparatus of claim 1, wherein the display apparatus is foldable such that a portion of the display area faces another portion of the display area.

16. A display apparatus comprising:

a display panel being foldable along a folding axis extending in a first direction, the display panel having a first surface comprising a display area;

a cover disposed below the display panel, the cover comprising a first side surface and a second side surface facing in opposite directions to each other;

a first sensor portion and a second sensor portion spaced apart from each other in a plan view, the first sensor portion and the second sensor portion configured to provide a fingerprint recognition area to the display area of the first surface of the display panel; and a first lateral sensor portion and a second lateral sensor portion configured to provide a fingerprint recognition area to the first side surface and the second side surface of the cover, respectively.

17. The display apparatus of claim 16, wherein, in a plan view, a center of the first sensor portion and a center of the second sensor portion are respectively apart from a first corner and a second corner of the display area by about 20 mm to about 100 mm, and in a plan view, a center of the first lateral sensor portion and a center of the second lateral sensor portion are respectively apart from the first corner and the second corner of the display area by about 20 mm to about 100 mm.

* * * * *